(12) United States Patent
Derluyn

(10) Patent No.: US 12,034,068 B2
(45) Date of Patent: Jul. 9, 2024

(54) HIGH ELECTRON MOBILITY TRANSISTOR

(71) Applicant: Soitec Belgium, Hasselt (BE)

(72) Inventor: Joff Derluyn, Sint-Joris-Weert (BE)

(73) Assignee: SOITEC BELGIUM, Hasselt (BE)

(*) Notice: Subject to any disclaimer, the term of this patent is extended or adjusted under 35 U.S.C. 154(b) by 273 days.

(21) Appl. No.: 17/370,287

(22) Filed: Jul. 8, 2021

(65) Prior Publication Data

US 2021/0336042 A1 Oct. 28, 2021

Related U.S. Application Data

(63) Continuation of application No. 16/623,940, filed as application No. PCT/EP2018/066311 on Jun. 19, 2018, now Pat. No. 11,094,812.

(30) Foreign Application Priority Data

Jun. 19, 2017 (EP) .................................... 17176699

(51) Int. Cl.
 *H01L 29/778* (2006.01)
 *H01L 29/08* (2006.01)
 (Continued)

(52) U.S. Cl.
 CPC ...... *H01L 29/7783* (2013.01); *H01L 29/0847* (2013.01); *H01L 29/2003* (2013.01);
 (Continued)

(58) Field of Classification Search
 CPC ................ H01L 29/7782; H01L 29/66522
 See application file for complete search history.

(56) References Cited

U.S. PATENT DOCUMENTS 11,094,812 B2 * 8/2021 Derluyn .............. H01L 29/7783
2009/0146185 A1 6/2009 Suh et al.
(Continued)

FOREIGN PATENT DOCUMENTS

| CN | 103718300 A | 4/2014 |
|---|---|---|
| CN | 106549051 A | 3/2017 |
| WO | 2011163318 A2 | 12/2011 |

OTHER PUBLICATIONS

Ibbetson et al., "Polarization Effects, Surface States, and the Source of Electrons in AlGaN/GaN Heterostructure Field Effect Transistors," Applied Physics Letters, vol. 77, No. 2, Jul. 10, 2000.
(Continued)

*Primary Examiner* — Grant S Withers
(74) *Attorney, Agent, or Firm* — Workman Nydegger

(57) ABSTRACT

A high electron mobility transistor for analog applications comprising: a substrate; an epitaxial III-N semiconductor layer stack on top of said substrate, said epitaxial III-N semiconductor layer stack comprising: a first active III-N layer; and a second active III-N layer comprising a recess; with a two dimensional Electron Gas in between III-N; a gate on top of said epitaxial III-N semiconductor layer stack; and a passivation stack between said epitaxial III-N semiconductor layer stack and said gate, wherein said passivation stack comprises an electron accepting dielectric layer adapted to deplete said two dimensional Electron Gas when said gate is not biased; wherein said electron accepting dielectric layer extends in said recess and comprises magnesium nitride doped with silicon and/or aluminum.

17 Claims, 13 Drawing Sheets

(51) Int. Cl.
*H01L 29/20* (2006.01)
*H01L 29/66* (2006.01)

(52) U.S. Cl.
CPC .. *H01L 29/66462* (2013.01); *H01L 29/66522* (2013.01); *H01L 29/7782* (2013.01); *H01L 29/7786* (2013.01)

(56) References Cited

U.S. PATENT DOCUMENTS

| | | |
|---|---|---|
| 2013/0153963 A1 | 6/2013 | Shealy et al. |
| 2014/0252369 A1 | 9/2014 | Lee et al. |
| 2014/0346526 A1 | 11/2014 | Kanamura |
| 2015/0144955 A1 | 2/2015 | Cheng |
| 2015/0349117 A1 | 12/2015 | Chu et al. |

OTHER PUBLICATIONS

Onojima et al., "Effects of Si Deposition on AlGaN Barrier Surfaces in GaN Heterostructure Field-Effect Transistors," Applied Physics Express, vol. 1, Issue 071101, Jun. 27, 2008.
Quirk et al., "Band Gap and Electronic Structure of MgSiN2," Applied Physics Letters, vol. 105, Issue 112108, Sep. 10, 2014.
European Search Report from EP Application No. EP17176699, Nov. 29, 2017.
International Search Report and Written Opinion from PCT Application No. PCT/EP2018/066311, Sep. 25, 2018.
Chinese Office Action from corresponding CN Application No. 201880040483.4, Jan. 19, 2023.

\* cited by examiner

HIGH ELECTRON MOBILITY TRANSISTOR

FIELD OF THE INVENTION

The present invention generally relates to semiconductor devices and, more particularly, to high electron mobility transistors that comprise nitride-based active layers.

BACKGROUND OF THE INVENTION

Semiconductor devices comprising Gallium Nitride, also referred to as GaN, have the ability to carry large currents and to support high voltages. This makes them increasingly desirable for power semiconductor devices. In the recent years, research efforts focused on developing devices for high power/high frequency applications. In general, the manufactured devices for these types of applications are based on device structures that exhibit high electron mobility and are referred to as heterojunction field effect transistors, also called HFETs, high electron mobility transistors, also called HEMTs, or modulation doped field effect transistors, also called MODFETs. HEMTs are for example useful for analog circuit applications, such as RF/microwave power amplifiers or power switches. Such devices can typically withstand high voltages, e.g. up to 1000 Volts, or operate at high frequencies, e.g. from 100 kHz to 100 GHz.

There exist two types of polarization in wurzite III-nitride layer, namely piezoelectricity and spontaneous polarization. Piezoelectricity can occur if the crystal is non-centrosymmetric and the constituent atoms differ in size and electronegativity. For example, a Wurtzite crystal or a GaN layer are non-centrosymmetric. Spontaneous polarization is a special case of the above and occurs if the crystal is distorted from its ideal shape, for example due to different size of its constituent atoms such as Ga and N atoms.

A GaN-based HEMT comprises at least two nitride layers. The nitride layers are formed of different materials which have different bandgaps and a different degree of polarisation. The different materials in the adjacent nitride layers cause a discrete step in the polarization and bandgap energy, which contributes to a conductive two dimensional Electron Gas, also referred to as 2DEG, which allows charge to flow through the device and which is located near the junction of the two layers, and more particularly in the layer with the narrower bandgap. In the scientific publication entitled "Polarization effects, surface states, and the source of electrons in AlGaN/GaN heterostructure field effect transistors" published on Jul. 10, 2000 in Applied Physics Letters Volume 77, number 2, Ibbetson et al. theoretically and experimentally examine the origin of the 2DEG in AlGaN/GaN heterostructure field effect transistors. The structure comprises the following space charge components: a buffer polarization charge in the GaN layer which is ionic and fixed, a surface charge due to ionized donors on top of the AlGaN layer, fixed and ionic polarization-induced charges at the AlGaN/GaN interface and the top surface of the AlGaN layer and a negative charge due to the electrons in the quantum wells in the 2DEG region. The sum of the various charges is zero since the structure as a whole must be charge neutral in the absence of an externally applied field. Ibbetson et al. theoretically and experimentally demonstrate that the donor-like surface states such as Ga-dangling bonds or impurities at the surface of the AlGaN layer are likely a source of 2DEG electrons in HFETs.

In the scientific publication entitled "Effects of Si deposition on AlGaN barrier surfaces in GaN heterostructure field-effect transistors" published on Jun. 27, 2008, Onojima et al. illustrate schematic models that explain the reduction of the AlGaN potential barrier height and the increase in the 2DEG density of AlGaN/GaN HFETs due to silicon nitride passivation, also referred to as SiN passivation. The possible cause for the reduction of the AlGaN potential barrier height is that the Si atoms located at the SiN/AlGaN interface act as positively ionized donors which can partially neutralize the negative polarization charges of the AlGaN surface and thereby increase the 2DEG density through polarization effects.

Because of the 2DEG region existing under the gate at zero gate bias, most nitride devices are normally on, or so-called depletion mode devices. A certain negative voltage on the gate, called threshold voltage, is required to deplete the 2DEG through capacitive coupling. For certain applications, such as e.g. power switching, a non-zero gate voltage to switch off the device is undesired. In such a case, the gate control needs to work in such a way that, if the controlling circuitry fails for whatever reason, there is no galvanic connection between the source and the drain. If the 2DEG region is depleted, i.e. removed, below the gate at zero applied gate bias, the device can be an enhancement mode device. Enhancement mode devices are normally off and are desirable because of the added safety they provide. An enhancement mode device requires a positive bias applied at the gate in order to conduct current. In particular, a positive voltage is applied to the gate in order to move the 2DEG below the Fermi level. Once another voltage is applied between the source and the drain, the electrons in the 2DEG move from source to drain. In another case, having the opportunity to co-integrate normally-on and normally-off devices allows the creation of logic functionality, such as NOT, OR, AND, NOR, NAND and XOR gates. In another case, enhancement mode devices eliminate the need for a negative supply voltage, thereby reducing circuit complexity and cost.

It can be understood from Onojima et al. that, when passivating the surface of a Ga-based HEMT with SiN, the Si atoms of the SiN layer give electrons to the 2DEG of the HEMT, thereby populating the channel of the HEMT. The crystalline SiN is a continuation of the III-nitride crystal and Si atoms act as donors. In other words, a SiN passivation layer at the surface of a Ga-based HEMT enhances the 2DEG of the HEMT. Passivating the surface of a HEMT with SiN therefore prevents the depletion mode of a HEMT and promotes the conductivity of the 2DEG even at zero gate bias, so it consolidates normally-on operation. On the other hand, for applications using transistors as switches or high temperature capable integrated circuits, it is desirable to have normally off devices. Accordingly, there continues to be a need in the art for improved methods and structures for devices capable of performing in high power, high voltage, high speed and/or high temperature conditions.

It is an objective of the present invention to disclose a device that overcomes the above identified shortcomings of existing solutions. More particularly, it is an objective to disclose a high electron mobility transistor comprising an improved passivation layer and exhibiting an improved enhancement mode.

SUMMARY OF THE INVENTION

According to a first aspect of the present invention, the above defined objectives are realized by a high electron mobility transistor for analog applications, the high electron mobility transistor comprising:

a substrate;

an epitaxial III-N semiconductor layer stack on top of the substrate, the epitaxial III-N semiconductor layer stack comprising an active layer, the active layer comprising:
 a first active III-N layer; and
 a second active III-N layer comprising a recess in a gate region;
with a two dimensional Electron Gas between the first active III-N layer and the second active III-N layer;
a gate on top of the epitaxial III-N semiconductor layer stack; and
a passivation stack between the epitaxial III-N semiconductor layer stack and the gate, wherein the passivation stack comprises an electron accepting dielectric layer adapted to deplete the two dimensional Electron Gas when the gate is not biased; wherein the electron accepting dielectric layer extends in the recess and wherein the electron accepting dielectric layer comprises magnesium nitride doped with silicon and/or aluminum.

This way, the high electron mobility transistor of the present invention comprises an improved passivation stack which enhances the normally off operation and thereby improves the enhancement mode of the high electron mobility transistor. Indeed, the passivation stack of the high electron mobility transistor according to the present invention comprises an electron accepting dielectric layer which creates an acceptor level at the interface between the passivation stack and the epitaxial III-N semiconductor layer stack. The electron accepting dielectric layer of the present invention depletes electrons from the two dimensional Electron Gas, also referred to as 2DEG, when the gate of the high electron mobility transistor is not biased. No channel is therefore present and no current flow occurs until the high electron mobility transistor is biased for operation. In particular, in operation, a bias voltage is applied to the gate of the high electron mobility transistor in order to move the 2DEG from below the Fermi level. Once another voltage is applied between the source and the drain of the high electron mobility, the electrons in the 2DEG flow from source to drain. The high electron mobility transistor according to the present invention is therefore suitable for applications such as e.g. power switching or integrated logic for which negative polarity gate supply is undesired. The gate polarity of the high electron mobility transistor according to the present invention is additionally desirable because of the added safety it provides.

Because of the recess in the second active III-N layer and in the gate region, the high electron mobility transistor according to the present invention demonstrates a much higher leakage current from the gate to the 2DEG than a similar high electron mobility transistor which does not comprise a recess in the second active III-N layer. This is because in the case of a thinner barrier layer, there is an increased likelihood of increased tunneling, trap-assisted tunneling as well as a representing lower barrier height for electrons to overcome and be transported through thermionic emission, or TE and Field-assisted thermionic emission, or FTE. Doping magnesium nitride, or MgN, with silicon, also referred to as Si, and/or with aluminum, also referred to as Al, increases the bandgap of the electron accepting dielectric layer. When such electron accepting dielectric layer extends in the recess in the second active III-N layer in the gate region, and between the gate and the 2DEG, the leakage current is therefore reduced. Additionally, doping MgN with Si and/or Al increases the dielectric constant of the electron accepting dielectric layer, thereby allowing a better coupling between the gate and the 2DEG and demonstrating an improved conductance. Additionally, thanks to the recess in the second active III-N layer in the gate region, the electron accepting dielectric layer is brought closer to the 2DEG, thereby improving the effect of depletion of electrons from the 2DEG by the electron accepting dielectric layer when the gate is not biased. Doping magnesium nitride in the context of the invention is understood as alloying magnesium nitride with silicon and/or aluminum. In other words, the electron accepting dielectric layer is obtained by impurity doping independently from the method according to which it is manufactured. According to the present invention, SiN is alloyed with Al or Mg by introducing a well-controlled flow of respectively trimethylaluminium, also referred to as TMA, or bis-cyclo-pentadienyl-magnesium $(Cp)_2Mg$ in an MOCVD chamber during the deposition of SiN using silane, also referred to as $SiH_4$ or ammonia, also referred to as $NH_3$ precursors. In other words, the electron accepting dielectric layer comprises magnesium nitride alloyed with silicon and/or aluminum. Alternatively, the electron accepting dielectric layer comprises silicon nitride alloyed with magnesium and aluminum.

Nitride atoms of the electron accepting dielectric layer bond to Group III atoms of the second active III-N layer along the passivation contact interface. Incorporating Mg atoms in the passivation stack of a high electron mobility transistor therefore creates an electron accepting level at the interface between the epitaxial III-N semiconductor layer stack and the passivation stack, thereby depleting electrons from the 2DEG channel of the high electron mobility transistor when the gate is not biased. A negative surface charge is provided by the ionized Mg acceptors at the interface between the epitaxial III-N semiconductor layer stack and the passivation stack.

MgSiN depletes the channel of the high electron mobility transistor when the gate of the high electron mobility transistor is not biased and thereby improves the enhancement mode of the high electron mobility transistor. The material MgSiN of the electron accepting dielectric layer exhibits a large or wide bandgap, which makes it an interesting dielectric layer for the gate dielectric of a high electron mobility transistor to prevent leakage. The scientific publication of Quirk J. B. et al. entitled "Band gap and electronic structure of $MgSiN_2$" published in Applied Physics Letters Volume 105, Issue 11 in September 2014 discloses a bandgap of MgSiN equal to 6.3 eV. Aluminum doping, also referred to as Al doping increases the bandgap of the material of the electron accepting dielectric layer, which results in an even more interesting dielectric layer for the passivation of a high electron mobility transistor and the use as gate dielectric as a higher bandgap will more effectively block electrons from leaking to or from the gate. Additionally, Al doping influences the etching rate in Fluor-based plasma of the passivation stack. In other words, doping the passivation stack with Aluminum creates an etch stop layer for Fluor-based plasma etching. The bandgap of MgAlSiN is expected to be higher than 6 eV.

A two-dimensional electron gas is a gas of electrons free to move in two dimensions, but tightly confined in the first. This tight confinement leads to quantized energy levels for motion in that direction. The electrons appear to be a 2D sheet embedded in a 3D world. A device of particular interest for high power and/or high frequency applications is the high electron mobility transistor, also referred to as HEMT. According to the present invention, the passivation stack is formed between the epitaxial III-N semiconductor layer stack and the gate. The passivation stack may be formed only under the gate and may serve additionally as gate dielectric. Alternatively, the passivation stack may be formed on top of the epitaxial III-N semiconductor layer stack and may fully cover the epitaxial III-N semiconductor layer stack. Alternatively, the passivation stack may be formed on top of the epitaxial III-N semiconductor layer stack and partially cover the surface of the epitaxial III-N semiconductor layer stack, for example it may be formed in the ungated area between the source and the drain of the high mobility electron transistor according to the present invention, where it serves as passivation and prevents the depletion of the underlying 2DEG.

The bias voltage of the gate of the high electron mobility transistor according to the present invention depends on the thickness of the electron accepting dielectric layer, in particular towards positive voltages. Indeed, the electron accepting dielectric layer shifts the maximum gate bias of the high electron mobility transistor according to the present invention to large voltages and also shifts the threshold voltage of the high electron mobility transistor. A gate bias voltage of the high electron mobility transistor according to the present invention is comprised between −10 Volts and 20 Volts, preferably between 0 Volt and 10 Volts. A threshold voltage of the high electron mobility transistor according to the present invention is comprised between 1 Volt and 5 Volts, preferably between 1 Volt and 2 Volts. By contrast, for a normally on high electron mobility transistor, the gate bias voltage typically reaches −2 Voltages and the gate bias range of the high electron mobility transistor is in general comprised between −10 Volts and 2 Volts.

The second active III-N layer comprises a recess in a gate region, wherein the recess extends at least partially in said second active III-N layer and wherein the electron accepting dielectric layer extends in the recess such that the passivation surface is in direct contact with the second passivation surface in the recess.

This way, the high electron mobility transistor according to the present invention is an insulated gate HEMT with a recess under the gate formed in the second active III-N layer of the epitaxial III-N semiconductor layer stack. This way, the threshold voltage of the high electron mobility transistor shifts towards positive voltages and this improves the enhancement mode of the high electron mobility transistor.

Embodiments of the present invention may be particularly well suited for use in nitride-based devices such as Group III-nitride based HEMTs. Group III-nitride, or group III-N, refers to semiconductor compounds formed between elements in Group III of the periodic table, for example Boron, also referred to as B, Aluminum, also referred to as Al, Gallium, also referred to as Ga, Indium, also referred to as In, and Nitrogen, also referred to as N. Example of binary Group III-nitride compounds are GaN, AlN, BN, etc. Group III-nitride also refers to ternary and quaternary compounds such as for example AlGaN and InAlGaN.

Alternatively, the epitaxial III-N semiconductor layer stack comprises an epitaxially grown buffer layer grown between the substrate and the active layer. The buffer layer may be of a different nature than the substrate, in that for instance the bandgap of the substrate and buffer layer are relatively far apart (such as 1.1 eV and 6.2 eV respectively), in the sense that the buffer layer has a large bandgap, in order to provide present characteristics, such as high break down voltage, e.g. larger than 250 V, preferably larger than 500 V, even more preferably larger than 1000 V, such as larger than 2000 V, or even much larger. The buffer layer is in an example a III-N buffer layer with a large bandgap. Therein III refers to Group III elements, now being Group 13 and Group 3 elements, such as B, Al, Ga, In, Tl, Sc, Y and Lanthanide and Actinide series. The buffer layer comprises a stack of layers, in an example typically the first one being a nucleation layer.

According to an optional aspect of the invention, the high electron mobility transistor further comprises an interface between the epitaxial III-N semiconductor layer stack and the passivation stack, and wherein the electron accepting dielectric layer provides an electron acceptor level at the interface.

This way, when the gate is not biased, the 2DEG of the high electron mobility transistor is depleted as the electrons of the 2DEG are flowing towards the electron acceptor level at the interface between the epitaxial III-N semiconductor layer stack and the passivation stack. In other words, the electron accepting dielectric layer provides a negative surface charge via the presence of ionized electron accepting atoms at the interface between the epitaxial III-N semiconductor layer stack and the passivation stack, thereby depleting the electrons of the 2DEG of the high electron mobility transistor when the gate is not biased.

According to an optional aspect of the invention, the high electron mobility transistor further comprises an interface between the epitaxial III-N semiconductor layer stack and the passivation stack, and wherein the electron accepting dielectric layer provides an electron acceptor level in the passivation stack.

This way, when the gate is not biased, the 2DEG of the high electron mobility transistor is depleted as the electrons of the 2DEG are flowing towards the electron acceptor level in the passivation stack. In other words, the electron accepting dielectric layer provides a negative surface charge via the presence of ionized electron accepting atoms in the passivation stack, thereby depleting the electrons of the 2DEG of the high electron mobility transistor when the gate is not biased.

According to an optional aspect of the invention, the electron accepting dielectric layer comprises one or more of the following: MgSiN; MgAlN; MgSiAlN.

According to an optional aspect of the invention, the electron accepting dielectric layer comprises one or more of the following:

$Mg_xSi_{1-x}N$, wherein x is comprised between 0.05 and 0.95;

$Mg_yAl_{1-y}N$, wherein y is comprised between 0.05 and 0.95;

$Mg_aSi_zAl_{1-a-z}N$, wherein a is comprised between 0.05 and 0.95 and wherein z is comprised between 0.05 and 0.95 and wherein a+z is comprised between 0.1 and 1.

The term MgSiN relates to a composition comprising Mg, Si and N in any stochiometric ratio ($Mg_xSi_{1-x}N$) wherein x is comprised between 0.05 and 0.95. The term MgAlN relates to a composition comprising Mg, Al and N in any stochiometric ratio ($Mg_yAl_{1-y}N$) wherein y is comprised between 0.05 and 0.95. The term MgSiAlN relates to a composition comprising Mg, Si, Al and N in any stochiometric ratio ($Mg_aSi_zAl_{1-a-z}N$) wherein a is comprised between 0.05 and 0.95 and wherein z is comprised between 0.05 and 0.95 and wherein a+z is comprised between 0.1 and 1.

According to an optional aspect of the invention, the electron accepting dielectric layer comprises $Mg_xSi_{1-x}N$, wherein x is comprised between 0.05 and 0.95.

This way, the electronic density in the channel of the high electron mobility transistor can be modulated by tuning the parameter x of the composition of the electron accepting dielectric layer.

According to an optional aspect of the invention, the electron accepting dielectric layer comprises $Mg_ySi_{1-y}N$, wherein y is comprised between 0.05 and 0.95.

This way, the electronic density in the channel of the high electron mobility transistor can be modulated by tuning the parameter y of the composition of the electron accepting dielectric layer.

According to an optional aspect of the invention, the electron accepting dielectric layer comprises $Mg_aSi_zAl_{1-a-z}N$, wherein a is comprised between 0.05 and 0.95 and wherein z in comprised between 0.05 and 0.95 and wherein a+z is comprised between 0.1 and 1.

This way, the electronic density in the channel of the high electron mobility transistor can be modulated by tuning the parameter z of the composition of the electron accepting dielectric layer. The bandgap of the material of the electron accepting dielectric layer can be modulated by tuning the parameters a and z.

According to an optional aspect of the invention, the electron accepting dielectric layer is epitaxially grown on top of the epitaxial III-N semiconductor layer stack.

This way, the electron accepting dielectric layer is formed with the formation of the epitaxial III-N semiconductor layer stack. A fully crystalline electron accepting dielectric layer is epitaxially grown on top of the epitaxial III-N semiconductor layer stack. Alternatively, a partially crystalline electron accepting dielectric layer is epitaxially grown on top of the epitaxial III-N semiconductor layer stack. The electron accepting dielectric layer may be formed by ex-situ deposition with the help of epitaxy tools like atomic layer deposition, also referred to as ALD, chemical vapor deposition, also referred to as CVD, or physical vapor deposition, also referred to as PVD. Alternatively, the electron accepting dielectric layer may be formed by in-situ deposition in a MOCVD or a MBE chamber. Alternatively, the electron accepting dielectric layer may be formed by depositing an amorphous film of the same material and recrystallizing it using thermal anneal.

The difference in lattice constant between the first active III-N layer and the second active III-N layer produces a strain that can result in dislocation of the active layer. This strain can result in interface trap states that slow the response of the device. The interface trap states are associated with surface states created by dangling bonds, oxygen or hydroxyl adatoms, threading dislocations accessible at the surface of the second active III-N layer. The electron accepting dielectric layer epitaxially grown on top of the epitaxial III-N semiconductor layer stack therefore terminates and passivates dangling bonds on the surface of the second active III-N layer of the epitaxial III-N semiconductor layer stack to limit the number of interfacial traps, prevents oxygen or hydroxyl ions from migrating to and bonding on the surface of the second active III-N layer, and helps to improve the device performance. In other words, the passivation stack reduces or eliminates the effects at the surface of the epitaxial III-N semiconductor layer which are responsible for degrading device performance, such as for example drain current degradation, larger threshold voltage fluctuation, larger off-current leakage, etc. due to the presence of trapping states between the gate and the drain of the high electron mobility transistor. Additionally, the crystalline passivation stack may have a lattice constant that matches with the epitaxial III-N semiconductor layer and the passivation stack on top of it, hence providing suitable bond-matching to either side of the interface and thus reducing the interfacial traps between the epitaxial III-N semiconductor layer and the passivation stack. It also reduces the effects of surface traps by providing a coherent termination of the surface bonds. This way, a good interface can be realized by introducing this crystalline passivation stack.

According to an optional aspect of the invention, the first active III-N layer comprises InAlGaN, and wherein the second active III-N layer comprises InAlGaN, and wherein the second active III-N layer comprises a bandgap larger than a bandgap of the first active III-N layer and wherein the second active III-N layer comprises a polarization larger than the polarization of the first active III-N layer.

This way, the use of different materials in adjacent first active III-N layer and second III-N layer causes polarization which contributes to a conductive 2DEG region near the junction between the first active III-N layer and the second active III-N layer, in particular in the first active III-N layer which comprises a bandgap narrower than the bandgap of the second active III-N layer.

The first active III-N layer for example has a thickness comprised between 20 and 500 nm, preferably between 30 and 300 nm, more preferably between 50 and 250 nm, such as for example from 100 to 150 nm. The second active III-N layer for example has a thickness comprised between 10 to 100 nm, preferably between 20 to 50 nm. Such a combination of thicknesses provides good characteristics for the active layer, for example in terms of the 2DEG obtained.

The first active III-N layer comprises nitride and one or more of B, Al, Ga, In and Tl. The first active III-N layer for example comprises GaN. The second active III-N layer comprises nitride and one or more of B, Al, Ga, In, and Tl. The second active III-N layer for example comprises AlGaN. The term AlGaN relates to a composition comprising Al, Ga and N in any stochiometric ratio $(Al_xGa_yN)$ wherein x is comprised between 0 and 1 and y is comprised between 0 and 1. Alternatively, the second active III-N layer for example comprises AlN. Alternatively, the second active III-N layer comprises InAlGaN. A composition such as InAlGaN comprises In in any suitable amount. Alternatively, both first active III-N layer and second active III-N layer comprise InAlGaN, and the second active III-N layer comprises a bandgap larger than a bandgap of the first active III-N layer and wherein the second active III-N layer comprises a polarization larger than the polarization of the first active III-N layer. Alternatively, both first active III-N layer and second active III-N layer comprise BInAlGaN, and the second active III-N layer comprises a bandgap larger than a bandgap of the first active III-N layer and wherein the second active III-N layer comprises a polarization larger than the polarization of the first active III-N layer. Compositions of the active layer may be chosen in view of characteristics to be obtained, and compositions may vary accordingly. For example, good results were obtained with a first active III-N layer comprising GaN of about 150 nm thickness and a second active III-N layer comprising AlGaN of about 20 nm thickness.

According to an optional aspect of the invention, the substrate comprises one or more of the following: Si, Silicon-On-Insulator, Silicon Carbide, Sapphire.

This way, the manufacturing of the high electron mobility of the present invention is compatible with existing manufacturing techniques developed for the complementary metal-oxide-semiconductor technology and processes. In other words, the manufacturing of the high electron mobility transistor is CMOS-compatible as present features and present process steps can be integrated therein without much additional effort. This reduces the complexity and the costs associated with manufacturing such as transistor. Preferably, the substrate is a Si substrate, such as a <111> Si substrate, and combinations of thereof, and substrates comprising initial layers, such as a stack of layers. Alternatively, the substrate of the high electron mobility transistor comprises Germanium, also referred to as Ge, or Ge-On-Insulator, etc. Alternatively, the substrate of the high electron mobility transistor comprises a free-standing GaN substrate, a free-standing AlN substrate.

According to an optional aspect of the invention, the passivation stack further comprises an oxide layer.

This way, the passivation stack of the high electron mobility transistor comprises an oxide layer which acts as a gate insulator to the gate of the high electron mobility transistor. The oxide layer exhibits an electrically clean interface to the gate, a high dielectric constant to maximize electrostatic coupling between gate and 2DEG which results in an increase of the transconductance of the high electron mobility transistor and a sufficient thickness to avoid dielectric breakdown and leakage by quantum tunneling.

According to an optional aspect of the invention, the oxide layer comprises MgO.

This way, the gate insulator in the presence of the oxide layer demonstrates a high dielectric constant, which allows for higher capacitance.

According to an optional aspect of the invention, the gate is formed on top of the oxide layer.

This way, the oxide layer is formed to be comprised between the gate of the high electron mobility transistor and the electron accepting dielectric layer. In other words, the electron accepting dielectric layer is epitaxially formed on top of the epitaxial III-N semiconductor layer, the oxide layer is formed on top of the electron accepting dielectric layer and the gate is formed on top of the oxide layer.

According to an optional aspect of the invention:
the electron accepting dielectric layer comprises a passivation surface in contact with the epitaxial III-N semiconductor layer stack and a dielectric surface opposite to the passivation surface; and
the second active III-N layer comprises a second passivation surface in contact with the passivation surface of the electron accepting dielectric layer, thereby defining a passivation contact interface between the second active III-N layer and the electron accepting dielectric layer.

According to an optional aspect of the invention:
the electron accepting dielectric layer comprises a passivation surface in contact with the epitaxial III-N semiconductor layer stack and a dielectric surface opposite to the passivation surface;
the oxide layer comprises an oxide surface in contact with the dielectric surface and a passivation insulating surface opposite to the oxide surface;
the dielectric surface and the oxide surface extend such that the oxide surface is in direct contact with the dielectric surface along the full surface of the dielectric surface;
the gate comprises a biasing surface via which a voltage bias is applied to the gate and a gate insulating surface opposite to the biasing surface;
the gate is formed on top of the oxide layer, thereby defining an insulating contact interface between the passivation insulating surface and the gate insulating surface.

This way, an interface is formed between the electron accepting dielectric layer comprising for example MgSiN or MgAlN or MgSiAlN and the oxide layer comprising for example MgO. Additionally, an interface is formed between the oxide layer comprising for example MgO and the gate of the high electron mobility transistor. Alternatively, the dielectric surface and the oxide surface extend such that the oxide surface is in direct contact with the dielectric surface along 10% to 100% of the surface of the dielectric surface. The gate of the high electron mobility transistor is biased via the gate insulating surface. In other words, a voltage is applied on the gate insulating surface to bias the high electron mobility transistor in operation.

According to an optional aspect of the invention, the insulating contact interface extends such that the gate insulation surface is in direct contact with 10% to 100% of the passivation insulating surface.

This way, when the gate insulation surface extends along 100% of the passivation insulating surface, the oxide layer is completely comprised between the electron accepting dielectric layer and the gate, i.e. under the gate of the high electron mobility transistor. When the gate insulation surface is in direct contact with the passivation insulating surface but not along the full passivation insulating surface, the oxide layer for example extends more than the gate and for example extends between the source and the drain of the high electron mobility transistor.

According to an optional aspect of the invention, the electron accepting dielectric layer comprises a passivation surface in contact with the epitaxial III-N semiconductor layer stack and a dielectric surface opposite to the passivation surface; and the second active III-N layer comprises a second passivation surface in contact with the passivation surface of the electron accepting dielectric layer, thereby defining a passivation contact interface between the second active III-N layer and the electron accepting dielectric layer.

According to an optional aspect of the invention, nitride atoms of the electron accepting dielectric layer bond to Group III atoms of the second active III-N layer along the passivation contact interface.

This way, the potential barrier height in the second active III-N layer increases and the 2DEG density of the high electron mobility transistor decreases when the gate is not biased, due to the presence of the passivation stack and more particularly to the presence of the electron accepting dielectric layer. Indeed, when the electron accepting dielectric layer comprises for example MgSiN or MgAlN or MgSiAlN, the Mg atoms located at the passivation surface of the electron accepting dielectric layer act as negatively ionized donors, which can partially neutralize the positive polarization charges of the second active III-N layer and thereby decrease the 2DEG density through polarization effects. In other words, the atoms of the electron accepting dielectric layer, for example the Mg atoms when the electron accepting dielectric layer comprises MgSiN or MgAlN or MgSiAlN, therefore serve as acceptors for electrons of the 2DEG, thereby depleting the channel when the gate of the high electron mobility transistor is not biased.

According to an optional aspect of the invention:
the passivation contact interface extends such that the passivation surface is in direct contact with 10 to 30% of the second passivation surface in a gate region; and
the passivation stack further comprises two electron donating dielectric layers formed on top of the second active III-N layer and on both sides of the electron accepting dielectric layer such that each of two electron donating dielectric layers comprises a III-N contact surface in direct contact with the second active III-N layer.

This way, the electron accepting dielectric layer does not extend along the full surface of the second passivation surface of the second active III-N layer.

This way, the electron accepting dielectric layer is surrounded by an electron donating dielectric layer on each side of the electron accepting dielectric layer. In other words, the passivation surface of the electron accepting dielectric layer is in direct contact with the second passivation surface and on each side of the electron accepting dielectric layer of the high electron mobility transistor is formed an electron donating dielectric layer. This electron donating dielectric layer improves the passivation of the second active III-N layer in regions in which no electron accepting dielectric layer is formed op top of the second active III-N layer. In other words, each of the electron donating dielectric layers is in direct contact with the second active III-N layer.

According to an optional aspect of the invention, the electron donating dielectric layers comprise SiN.

The electron donating dielectric layer is SiN with high density, deposited in-situ in an MOCVD reactor. The SiN may be stochiometric or non-stochiometric. It has been shown experimentally by inventors that for example a HEMT structure that is capped with in-situ SiN is not affected by processing steps, even those that have a high temperature budget. Alternatively, the electron donating dielectric layer comprises AlSiN. The Al-doping allows increasing the bandgap of the dielectric material. Alternatively, the electron donating dielectric layer comprises one or more of Si, Al, O and N. The electron donating dielectric layer has a thickness of 1 to 500 nm, preferably 30 to 400 nm, more preferably 50 to 300 nm, such as 100 to 200 nm. The in-situ SiN may be thickened externally by PECVD or LPCVD SiN or $SiO_x$, for example for thicknesses beyond 500 nm, before any other processing takes place. A thin electron donating dielectric layer allows the formation of ohmic contacts with a low resistance. Additionally, the electron donating dielectric layer comprises Si which can diffuse in the AlGaN where it acts as a donor. The introduction of a donor type in the AlGaN layer facilitates the ohmic contact formation reducing thereby the contact resistance. The electron donating dielectric layer is formed at a temperature between 700° C. and 1300° C., between 700° C. and 1250° C., between 700° C. and 1100° C. It should be understood that when SiN is mentioned, a compound consisting of Si and N is meant. SiN can include $Si_3N_4$, but also other formulas are included, such as, but not limited hereto, $Si_xN_y$, being in different stochiometric or non-stochiometric ratios. In the formula $Si_xN_y$, x and y can be defined as real numbers, with $0<x\leq100$ and $0<y\leq100$. When the epitaxial III-N semiconductor layer stack is grown, $NH_3$ is kept flowing in the reaction chamber and the $SiH_4$ line is opened, allowing for growth of SiN and high temperature. After growth of SiN, the $SiH_4$ flow is stopped and the structure is cooled down to room temperature while keeping the $NH_3$ flow, to avoid desorption from the top layer.

According to an optional aspect of the invention, the electron donating dielectric layers are epitaxially grown on top of the second active III-N layer.

It is an advantage that the crystallinity of in-situ grown SiN is maintained by doping it or adding a species such as Al or B. When grown on top of the second active III-N layer, the in-situ SiN deforms to accommodate to the strain resulting from the lattice mismatch between the materials. It is well known that large lattice mismatch is a trigger to revert the epitaxial growth mode from a two-dimensional Franck-Van der Merwe layer-by-layer growth mode into a three-dimensional Volker-Weber growth mode, which is then in turn more prone to turn into an amorphous growth mode. A smaller atom than Si can thus be incorporated into the SiN, for example Al or B, to shrink the lattice constant of the beta-phase SiN and match it better to the lattice constant of the second active III-N layer. An additional advantage of the inclusion of Al in the SiN lattice is an improved resistance to dry etching in fluorine-based plasmas because of the interaction between Al and F which yields highly involatile AlF. The electron donating dielectric layers are fully crystalline. Alternatively, the electron donating dielectric layers are partially crystalline and comprise at least a few crystalline monolayers at the interface with the second passivation surface of the second active III-N layer.

According to an optional aspect of the invention, the electron donating dielectric layers each comprise a SiN III-N contact surface in direct contact with the second active III-N layer.

According to an optional aspect of the invention, the electron donating dielectric layers are each etched away respectively in a source region and a drain region.

This way, openings are defined in the electron donating dielectric layers to uncover respectively a source region and a drain region in which the device terminals are to be formed. For example, a photolithography step may be performed and the electron donating dielectric layers may be etched away respectively in a source region and in a drain region. For example, the electron donating dielectric layers can be removed by wet etching in HF or buffered HF or by dry etching in a RIE or ICP plasma tool in a fluorine chemistry.

Both dry and wet etches of the electron donating dielectric layers in a fluorine chemistry will stop on the second active III-N layer which acts as an etch-stop with very high selectivity. For example, the etch of the electron donating dielectric layers is done in a dry etching system based on fluorine chemistry such as for example in an inductively coupled plasma system using $SF_6$ or $CF_4$ as etching gas and RF, or "platen", and ICP, or "coil" etching powers of 10 W to 150 W respectively. This allows for thorough removal of the remaining electron donating dielectric layer without removing the second active III-N layer or any of the layers below. Alternatively, the second active III-N layer is partially etched in a wet etch, for example in an alkaline solution or in resist developer, thereby allowing to form respective ohmic contacts in a source region and in a drain region partly in the active layer.

According to an optional aspect of the invention, the passivation contact interface extends such that the passivation surface is in direct contact with the second passivation surface along the full surface of the second passivation surface.

In this case, the electron accepting dielectric layer does extend along the full surface of the second passivation surface of the second active III-N layer.

According to an optional aspect of the invention, the electron accepting dielectric layer is etched away respectively in a source region and a drain region.

In this case, the electron accepting dielectric layer fully covers the second active III-N layer, and no electron donating dielectric layers are formed on each side of the electron accepting dielectric layer. Openings are defined in the electron accepting dielectric layer to uncover respectively a source region and a drain region in which the device terminals are to be formed. For example, a photolithography step may be performed and the electron accepting dielectric layer may be etched away respectively in a source region and in a drain region. For example, the electron accepting dielectric layer can be removed by dry etching.

According to an optional aspect of the invention, an ohmic contact is formed respectively in the source region and in the drain region.

The source and the drain contacts are ohmic contacts to the 2DEG and can be made by depositing metal stacks, such as for example Ti/Al/Ni/Au, Ti/Al/Mo/Au, Ti/Al/Ti/Au, Ti/Al/Ti/W, Ti/Al/W, Ti/Al/W/Cr, Ta/Al/Ta, V/Al/Ni/Au, etc., in contact with the second active III-N layer of the active layer. The second active III-N layer may be recessed prior to metal deposition. The contact properties may be further improved by thermal annealing, typically at a temperature comprised between 800° C. and 900° C., such as for example 850° C., in a nitrogen atmosphere or a forming gas atmosphere. Alternatively, additional metal interconnect layers are defined using methods known to a person skilled in the art, to allow low resistivity current pathways for the gate, source and drain currents.

According to an optional aspect of the invention, the epitaxial III-N semiconductor layer stack is adapted to host an electronic channel between the source region and the drain region when a positive bias voltage is applied to the gate.

This way, once a bias voltage is applied to the gate which is larger than the threshold voltage of the high electron mobility transistor, electrons flow in the electronic channel under the gate between the source and the drain of the high electron mobility transistor.

According to an optional aspect of the invention, the electron accepting dielectric layer is 0.1 to 3 nm thick.

This way, the electron accepting dielectric layer may be a single layer, such as for example a single MgSiN or MgAlN or MgSiAlN layer, and therefore have the thickness of a single atomic monolayer. Alternatively, the electron accepting dielectric layer may comprise a plurality of MgSiN or MgAlN or MgSiAlN atomic layers, such as for example two layers, three layers, four layers, five layers, ten layers, etc.

According to an optional aspect of the invention, the oxide layer is 1 to 30 nm thick, preferably 3 nm to 10 nm thick.

According to an optional aspect of the invention, a thickness of the two electron donating dielectric layers is substantially equal to a combined thickness of the electron accepting dielectric layer and the oxide layer.

This way, the outer surface of the high electron mobility transistor is planarized. Alternatively, the thickness of the two electron donating dielectric layers is different from the combined thickness of the electron accepting dielectric layer and of the oxide layer. In this case, a thick layer of SiN or of $SiO_x$ could be deposited on the finished high electron mobility transistor and could be planarized with for example CMP, thereby obtaining a substantially flat surface.

According to an optional aspect of the invention, the recess in the gate region extends completely through the second active III-N layer, thereby exposing the first active III-N layer.

According to an optional aspect of the invention, the electron accepting dielectric layer extends in the recess such that the passivation surface is in direct contact with the first active III-N layer in the recess.

According to an optional aspect of the invention, the passivation stack further comprises an AlN layer, wherein said AlN layer comprises AlN and such that the AlN layer is in direct contact with the first active III-N layer in the recess; and wherein the electron accepting dielectric layer extends in the recess on top of the AlN layer.

This way, the device according to the present invention is a MOSFET with a fully recessed, or in other words removed barrier, wherein the electron accepting dielectric layer is in contact with the channel layer in the first active III-N layer. This way, a true MOS type area under the gate is formed. The electron accepting dielectric layer forms a good interface to the first active III-N layer with possibility to have charge accumulation or inversion with positive bias, and the electron accepting dielectric layer ensures there is no charge at negative bias in the channel. According to an optional aspect of the invention, the AlN layer comprises AlN and the thickness of the AlN layer is less than 1 nm. Preferably, the AlN layer is a single monolayer of AlN. The AlN improves the electronic mobility of the channel. Aluminum nitride, also referred to as AlN, indeed demonstrates a wide bandgap, for example of more than 6 eV. Thanks to this wide bandgap of the AlN layer, the electrons flowing feel less the surface roughness at the interface between the first active III-N layer and the AlN layer, and the electrons consequently have a better mobility.

According to a second aspect of the invention, there is provided a method for manufacturing a high electron mobility transistor, the method comprising the steps of:
  providing a substrate;
  providing an epitaxial III-N semiconductor layer stack on top of the substrate, wherein the providing the epitaxial III-N semiconductor layer stack comprises providing an active layer comprising:
    a first active III-N layer; and
    a second active III-N layer;
  thereby forming a two dimensional Electron Gas between the first active III-N layer and the second active III-N layer;
  forming a recess in the second active III-N layer in a gate region;
  providing a passivation stack on top of the epitaxial III-N semiconductor layer stack, wherein the passivation stack comprises an electron accepting dielectric layer; and
  providing a gate op top of the electron accepting dielectric layer in the gate region such that the electron accepting dielectric layer depletes the two dimensional Electron Gas when the gate is not biased; wherein the electron accepting dielectric layer extends in the recess and wherein the electron accepting dielectric layer comprises magnesium nitride doped with silicon and/or aluminum.

This way, the high electron mobility transistor of the present invention comprises an improved passivation stack which enhances the normally off operation and thereby improves the enhancement mode of the high electron mobility transistor. Indeed, the passivation stack of the high electron mobility transistor according to the present invention comprises an electron accepting dielectric layer which creates an acceptor level at the interface between the passivation stack and the epitaxial III-N semiconductor layer stack. The electron accepting dielectric layer of the present invention depletes electrons from the two dimensional Electron Gas, also referred to as 2DEG, when the gate of the high electron mobility transistor is not biased. No channel is therefore present and no current flow occurs until the high electron mobility transistor is biased for operation. In particular, in operation, a bias voltage is applied to the gate of the high electron mobility transistor in order to move the 2DEG from below the Fermi level. Once another voltage is applied between the source and the drain of the high electron mobility, the electrons in the 2DEG flow from source to drain. The high electron mobility transistor according to the present invention is therefore suitable for applications such as e.g. power switching or integrated logic for which negative polarity gate supply is undesired. The gate polarity of the high electron mobility transistor according to the present invention is additionally desirable because of the added safety it provides.

Because of the recess in the second active III-N layer and in the gate region, the high electron mobility transistor according to the present invention demonstrates a much higher leakage current from the gate to the 2DEG than a similar high electron mobility transistor which does not comprise a recess in the second active III-N layer. It is therefore necessary to add a dielectric between the gate and the 2DEG. Doping magnesium nitride, or MgN, with silicon, also referred to as Si, and/or with aluminum, also referred to as Al, increases the bandgap of the electron accepting dielectric layer. When such electron accepting dielectric layer extends in the recess in the second active III-N layer in the gate region, the leakage current is therefore reduced. Additionally, doping MgN with Si and/or Al increases the dielectric constant of the electron accepting dielectric layer, thereby allowing a better coupling between the gate and the 2DEG and demonstrating an improved conductance. The specific use of MgSiN or MgAlN or MgSiAlN in the high electron mobility transistor according to the present invention allows the device is be suitable for applications such as e.g. power switching or integrated logic for which negative polarity gate supply is undesired. The gate polarity of the high electron mobility transistor according to the present invention is additionally desirable because of the added safety it provides.

MgSiN depletes the channel of the high electron mobility transistor when the gate of the high electron mobility transistor is not biased and thereby improves the enhancement mode of the high electron mobility transistor. The material MgSiN of the electron accepting dielectric layer exhibits a large bandgap, which makes it an interesting dielectric layer for the gate dielectric of a high electron mobility transistor to prevent leakage. The scientific publication of Quirk J. B. et al. entitled "Band gap and electronic structure of $MgSiN_2$," published in Applied Physics Letters Volume 105, Issue 11 in September 2014 discloses a bandgap of MgSiN equal to 6.3 eV. Aluminum doping, also referred to as Al doping increases the bandgap of the material of the electron accepting dielectric layer, which results in an even more interesting dielectric layer for the passivation of a high electron mobility transistor and the use as gate dielectric as a higher bandgap will more effectively block electrons from leaking to or from the gate. Additionally, Al doping influences the etching rate in Fluor-based plasma of the passivation stack. In other words, doping the passivation stack with Aluminum creates an etch stop layer for Fluor-based plasma etching. The bandgap of MgSiAlN is expected to be higher than 6 eV.

The electron accepting dielectric layer may be selectively grown on top of the active layer of the high electron mobility transistor. In this case, a dielectric layer, for example SiN or $SiO_x$, is deposited at the surface of the second active III-N layer. This dielectric layer may further comprise a sacrificial $SiO_x$ layer on top of the SiN when the dielectric layer comprises SiN. The dielectric layer and the sacrificial layer when present are then patterned by for example a lithography step and are then removed in the gate region of the high electron mobility transistor. Then the electron accepting dielectric layer is selectively grown by MOCVD or by MBE in the gate region. Alternatively, the electron accepting dielectric layer is grown via blanket growth on top of the active layer by MOCVD or be MBE. In this case, the electron accepting dielectric layer is then removed except in a gate region of the high electron mobility transistor, for example the electron accepting dielectric layer is etched away except in a gate region of the high electron mobility transistor.

According to an optional aspect of the invention, providing the electron accepting dielectric layer corresponds to epitaxially growing the electron accepting dielectric layer.

According to an optional aspect of the invention, providing the passivation stack on top of said epitaxial III-N semiconductor layer stack corresponds to epitaxially growing the passivation stack on top of the epitaxial III-N semiconductor layer stack.

According to an optional aspect of the invention, epitaxially growing is by MOCVD or MBE.

The crystalline electron accepting dielectric layer can be formed in-situ by epitaxial growth in a MOCVD or a MBE chamber. The first active III-N layer and the second active III-N layer can be formed in-situ by epitaxial growth in a MOCVD or a MBE chamber.

According to an optional aspect of the invention, the method further comprises the steps of:
  etching the passivation stack in a source region and a drain region; and
  forming an ohmic contact respectively in the source region and in the drain region.

According to an optional aspect of the invention, the method further comprises the steps of:
  providing an electron donating dielectric layer on top of the electron accepting dielectric layer;
  locally removing the electron donating dielectric layers in a gate region, thereby forming an opening in the electron donating dielectric layer and locally exposing the electron accepting dielectric layer;
  forming a gate electrode in the gate region;
  locally removing the electronic donating dielectric layer in a source region and in a drain region, thereby respectively forming an opening in the electron donating dielectric layer in the source region and locally exposing the second active III-N layer in the source region, and forming an opening in the electron donating dielectric layer in the drain region and locally exposing the second active III-N layer in the drain region; and
  forming an ohmic contact in the source region and an ohmic contact in the drain region.

This way, a gate electrode is provided in the gate region of the high electron mobility transistor is formed. Forming a gate electrode in the gate region comprise plurality of process steps. For example this step comprises depositing photoresist and performing a lithography step defining the foot of the gate contact by for example partially removing the oxide layer. In this way, some layers of the oxide layer remain below the gate of the high electron mobility transistor and form a gate dielectric to reduce trapping effects and leakage current. The gate electrode is for example a Metal-Oxide-Semiconductor gate, also referred to MOS gate, and can be made by depositing metal stacks, such as for example comprising Ni, Pt, W, WN, or TiN and capped by Al, Au or Cu. Metal patterns are consecutively defined by performing lift-off of the metal on top of the photoresist. Alternatively, the gate metal stack is deposited, for example comprising Ni, Pt, W, WN, or TiN and capped by Al, Au or Cu. Then the photoresist and the lithography steps are performed, and the thus defined photoresist patterns act as a mask for the dry etching of the metal stacks in areas where it is unwanted. Next the photoresist is removed.

Forming an ohmic contact in the source region and forming an ohmic contact in the drain region comprise plurality of process steps. For example, this is done by starting with depositing photoresist and defining the respective areas of the respective ohmic contacts with a lithography step. The electron donating dielectric layers are then partially or fully removed respectively in a source region and in a drain region. Alternatively, the electron accepting dielectric layer is fully removed in a source region and in a drain region. Once the areas of the ohmic contacts are defined, i.e. when the source region and the drain region have been defined, a metal layer or a stack of metal layers can be deposited, for example by thermal evaporation, or by sputtering, or by e-beam evaporation. Metal patterns are consecutively defined by performing lift-off of the metal, on top of the photoresist and not in contact with the second active III-N layer. Alternatively, the photoresist is first removed and the metal stack comprising for example Ti and Al is deposited and then a second photoresist deposition and photolithography steps are performed to allow dry etching of the metal stack in areas where it is unwanted and removing the photoresist. The defined ohmic contacts may then be subjected to one or more alloying steps, for example a rapid thermal annealing step for a duration of one minute in a reduced or inert atmosphere such as for example hydrogen or forming gas or nitrogen gas at a temperature for example between 800° C. and 900° C.

According to a third aspect of the invention, there is provided a use of an electron accepting dielectric layer comprising magnesium nitride doped with silicon and/or aluminum in a high electron mobility transistor for analog applications, the high electron mobility transistor comprising:
 a substrate;
 an epitaxial III-N semiconductor layer stack on top of the substrate, the epitaxial III-N semiconductor layer stack comprising an active layer, the active layer comprising:
  a first active III-N layer; and
  a second active III-N layer comprising a recess in a gate region;
 with a two dimensional Electron Gas between the first active III-N layer and the second active III-N layer;
 a gate on top of the epitaxial III-N semiconductor layer stack and in the gate region; and
 a passivation stack between the epitaxial III-N semiconductor layer stack and the gate, wherein the passivation stack comprises an electron accepting dielectric layer, and wherein the electron accepting dielectric layer extends in the recess and wherein the electron accepting dielectric layer comprises magnesium nitride doped with silicon and/or aluminum; for depletion of the two dimensional Electron Gas when the gate is not biased.

Nitride atoms of the electron accepting dielectric layer bond to Group III atoms of the second active III-N layer along the passivation contact interface. Incorporating Mg atoms in the passivation stack of a high electron mobility transistor therefore creates an electron accepting level at the interface between the epitaxial III-N semiconductor layer stack and the passivation stack, thereby depleting electrons from the 2DEG channel of the high electron mobility transistor when the gate is not biased. A negative surface charge is provided by the ionized Mg acceptors at the interface between the epitaxial III-N semiconductor layer stack and the passivation stack. The specific use of MgSiN or MgAlN or MgSiAlN in the electron accepting dielectric layer enhances the normally off operation and thereby improves the enhancement mode of the high electron mobility transistor. Indeed, the electron accepting dielectric layer creates an acceptor level at the interface between the passivation stack and the epitaxial III-N semiconductor layer stack. The electron accepting dielectric layer of the present invention depletes electrons from the two dimensional Electron Gas, also referred to as 2DEG, when the gate of the high electron mobility transistor is not biased. No channel is therefore present and no current flow occurs until the high electron mobility transistor is biased for operation. In particular, in operation, a bias voltage is applied to the gate of the high electron mobility transistor in order to move the 2DEG from below the Fermi level. Once another voltage is applied between the source and the drain of the high electron mobility, the electrons in the 2DEG flow from source to drain.

Because of the recess in the second active III-N layer and in the gate region, the high electron mobility transistor according to the present invention demonstrates a much higher leakage current from the gate to the 2DEG than a similar high electron mobility transistor which does not comprise a recess in the second active III-N layer. It is therefore necessary to add a dielectric between the gate and the 2DEG. Doping magnesium nitride, or MgN, with silicon, also referred to as Si, and/or with aluminum, also referred to as Al, increases the bandgap of the electron accepting dielectric layer. When such electron accepting dielectric layer extends in the recess in the second active III-N layer in the gate region, the leakage current is therefore reduced. Additionally, doping MgN with Si and/or Al increases the dielectric constant of the electron accepting dielectric layer, thereby allowing a better coupling between the gate and the 2DEG and demonstrating an improved conductance. The specific use of MgSiN or MgAlN or MgSiAlN in the high electron mobility transistor according to the present invention allows the device is be suitable for applications such as e.g. power switching or integrated logic for which negative polarity gate supply is undesired. The gate polarity of the high electron mobility transistor according to the present invention is additionally desirable because of the added safety it provides.

MgSiN depletes the channel of the high electron mobility transistor when the gate of the high electron mobility transistor is not biased and thereby improves the enhancement mode of the high electron mobility transistor. The material MgSiN of the electron accepting dielectric layer exhibits a large bandgap, which makes it an interesting dielectric layer for the gate dielectric of a high electron mobility transistor to prevent leakage. The scientific publication of Quirk J. B. et al. entitled "Band gap and electronic structure of $MgSiN_2$" published in Applied Physics Letters Volume 105, Issue 11 in September 2014 discloses a bandgap of MgSiN equal to 6.3 eV. Aluminum doping, also referred to as Al doping increases the bandgap of the material of the electron accepting dielectric layer, which results in an even more interesting dielectric layer for the passivation of a high electron mobility transistor and the use as gate dielectric as a higher bandgap will more effectively block electrons from leaking to or from the gate. Additionally, Al doping influences the etching rate in Fluor-based plasma of the passivation stack. In other words, doping the passivation stack with Aluminum creates an etch stop layer for Fluor-based plasma etching. The bandgap of MgAlSiN is expected to be higher than 6 eV.

DETAILED DESCRIPTION OF EMBODIMENT(S)

Figure 1A:
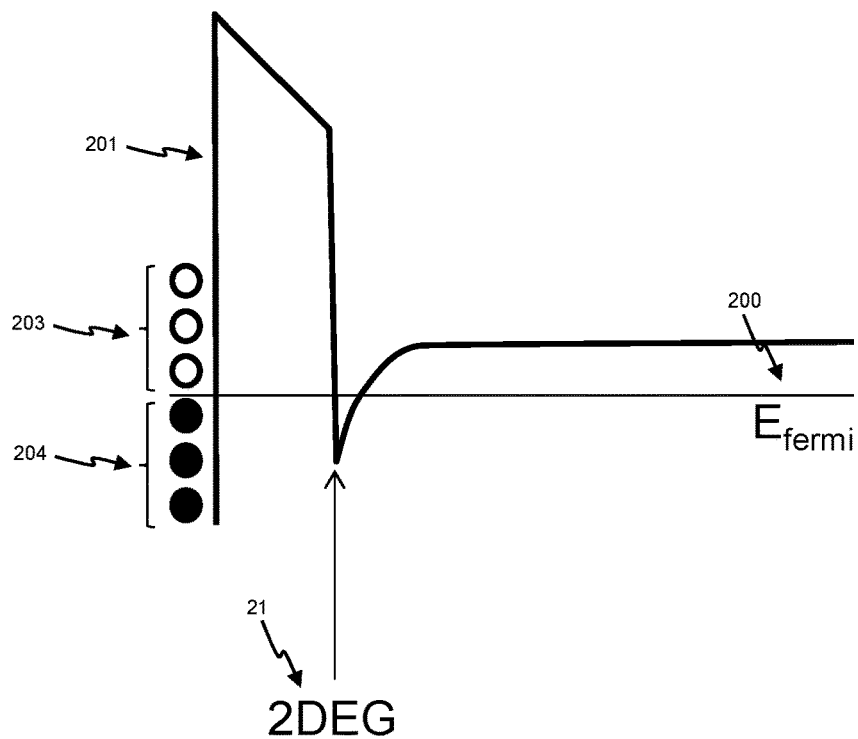
FIGS. 1A to 1C schematically illustrate the charge distribution in a prior art high electron mobility transistor (FIG. 1A), in a prior art high electron mobility transistor comprising a recess in a second active III-N layer (FIG. 1B) and in a high electron mobility transistor according to the present invention (FIG. 1C).
Figure 1B:
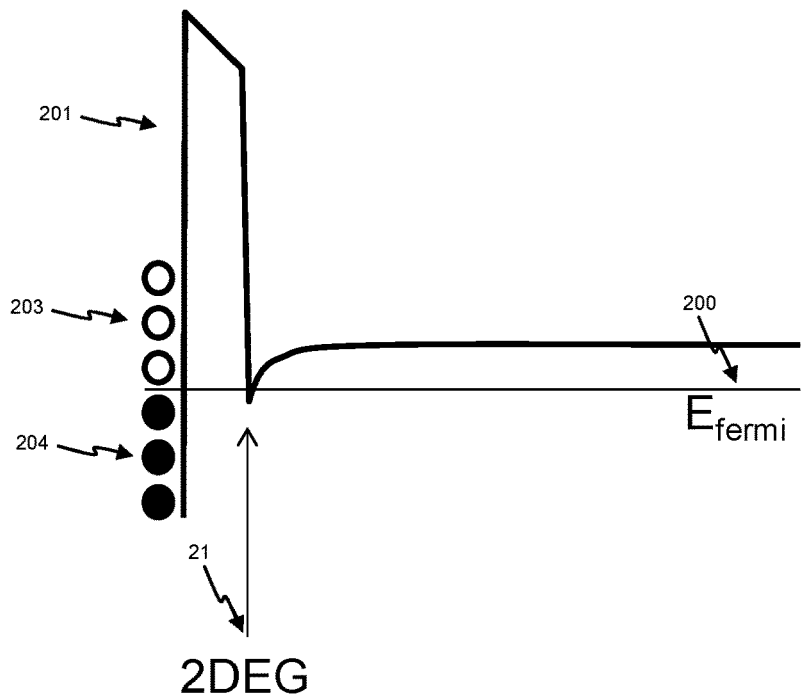
Figure 1C:
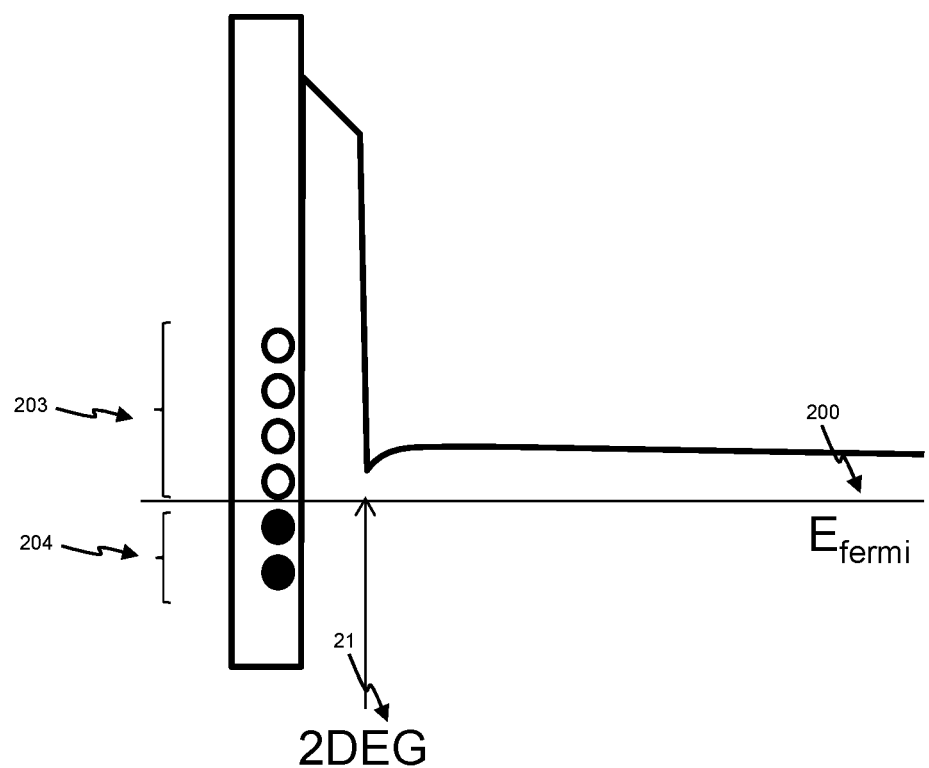

According to a prior art embodiment shown in FIG. 1A, the charge distribution in a standard high electron mobility transistor comprising a 2DEG 21 is schematically illustrated. In this case, the barrier 201 is large, and ionized surface donors 203 are present above the Fermi level 200 while non-ionized surface donors 204 are present below the Fermi level 200. According to a prior art embodiment shown in FIG. 1B, the charge distribution in a standard high electron mobility transistor comprising a 2DEG 21 and in which a recess is formed in the second active III-N layer is schematically illustrated. In this case, the barrier 201 is narrower than the barrier 201 of FIG. 1A, and as a result, the leakage current in this structure is much higher than in the HEMT 1 of FIG. 1A. Ionized surface donors 203 are present above the Fermi level 200 while non-ionized surface donors 204 are present below the Fermi level 200 in FIG. 1B. According to an embodiment shown in FIG. 1C, the charge distribution in a high electron mobility transistor according to the present invention comprising a 2DEG 21 and in which a recess is formed in the second active III-N layer and comprising an electron accepting dielectric layer comprising MgSiN or MgAlN or MgSiAlN is schematically illustrated. In this case, the barrier 201 is narrower than the barrier 201 of FIG. 1A, and as a result, the leakage current in this structure is much higher than in the HEMT 1 of FIG. 1A. But at the same time, the electron accepting dielectric layer comprises MgSiN or MgAlN or MgSiAlN which demonstrates a large bandgap and which, positioned between the gate and the channel of the HEMT, therefore reduces the leakage current. Ionized surface donors 203 are present above the Fermi level 200 while non-ionized surface donors 204 are present below the Fermi level 200 in FIG. 1C. The charge exchange between the barrier surface donor level and the electron accepting dielectric level created by the electron accepting dielectric layer leads to the modification of surface potential different from the Fermi level 200. In FIG. 1C, the number of ionized surface donors 203 is higher than the number of ionized surface donors 203 in HEMT which does not comprise a recess in the second active III-N layer nor an electron accepting dielectric layer, and it is also higher than the number of ionized surface donors 203 in HEMT which does comprise a recess in the second active III-N layer but which does not comprise an electron accepting dielectric layer. The combination of the presence of the recess in the second active III-N layer and of the specific choice of MgSiN or MgAlN or MgSiAlN as material for the electron accepting dielectric layer improves the depletion of the electrons from the 2DEG when the gate of the HEMT is not biased and therefore enhances the normally off operation of the HEMT, thereby improving its enhancement mode. A high electron mobility transistor of the present invention comprises an improved passivation stack which enhances the normally off operation and thereby improves the enhancement mode of the high electron mobility transistor. Indeed, the passivation stack of the high electron mobility transistor according to the present invention comprises an electron accepting dielectric layer which creates an acceptor level at the interface between the passivation stack and the epitaxial III-N semiconductor layer stack. The electron accepting dielectric layer of the present invention depletes electrons from the two dimensional Electron Gas, also referred to as 2DEG, when the gate of the high electron mobility transistor is not biased. No channel is therefore present and no current flow occurs until the high electron mobility transistor is biased for operation. In particular, in operation, a bias voltage is applied to the gate of the high electron mobility transistor in order to move the 2DEG from below the Fermi level 200. Once another voltage is applied between the source and the drain of the high electron mobility, the electrons in the 2DEG flow from source to drain. The high electron mobility transistor according to the present invention is therefore suitable for applications such as e.g. power switching or integrated logic for which negative polarity gate supply is undesired. The gate polarity of the high electron mobility transistor according to the present invention is additionally desirable because of the added safety it provides. Because of the recess in the second active III-N layer and in the gate region, the high electron mobility transistor according to the present invention demonstrates a much higher leakage current from the gate to the 2DEG than a similar high electron mobility transistor which does not comprise a recess in the second active III-N layer. Doping magnesium nitride, or MgN, with silicon, also referred to as Si, and/or with aluminum, also referred to as Al, increases the bandgap of the electron accepting dielectric layer. When such electron accepting dielectric layer extends in the recess in the second active III-N layer in the gate region, and between the gate and the 2DEG, the leakage current is therefore reduced. Additionally, doping MgN with Si and/or Al increases the dielectric constant of the electron accepting dielectric layer, thereby allowing a better coupling between the gate and the 2DEG and demonstrating an improved conductance. Additionally, thanks to the recess in the second active III-N layer in the gate region, the electron accepting dielectric layer is brought closer to the 2DEG, thereby improving the effect of depletion of electrons from the 2DEG by the electron accepting dielectric layer when the gate is not biased. Nitride atoms of the electron accepting dielectric layer bond to Group III atoms of the second active III-N layer along the passivation contact interface. Incorporating Mg atoms in the passivation stack of a high electron mobility transistor therefore creates an electron accepting level at the interface between the epitaxial III-N semiconductor layer stack and the passivation stack, thereby depleting electrons from the 2DEG channel of the high electron mobility transistor when the gate is not biased. A negative surface charge is provided by the ionized Mg acceptors at the interface between the epitaxial III-N semiconductor layer stack and the passivation stack. MgSiN depletes the channel of the high electron mobility transistor when the gate of the high electron mobility transistor is not biased and thereby improves the enhancement mode of the high electron mobility transistor. The material MgSiN of the electron accepting dielectric layer exhibits a large or wide bandgap larger than 6.3 eV, which makes it an interesting dielectric layer for the gate dielectric of a high electron mobility transistor to prevent leakage. Aluminum doping, also referred to as Al doping increases the bandgap of the material of the electron accepting dielectric layer, which results in an even more interesting dielectric layer for the passivation of a high electron mobility transistor and the use as gate dielectric as a higher bandgap will more effectively block electrons from leaking to or from the gate. Additionally, Al doping influences the etching rate in Fluor-based plasma of the passivation stack. In other words, doping the passivation stack with aluminum creates an etch stop layer for Fluor-based plasma etching. The bandgap of MgAlSiN is expected to be higher than 6 eV.

Figure 2A:
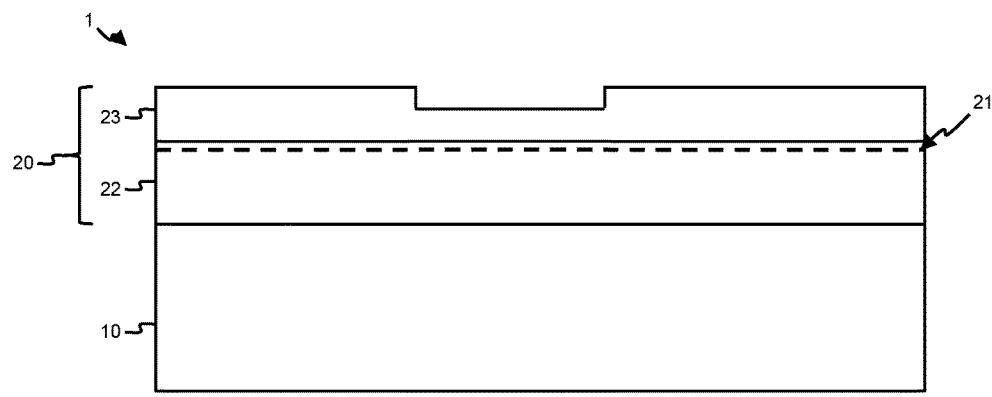
FIGS. 2A to 2C schematically illustrate an embodiment of a semiconductor structure according to the present invention, wherein said electron accepting dielectric layer is deposited in a gate region after etching a passivation stack in said gate region.
Figure 2B:
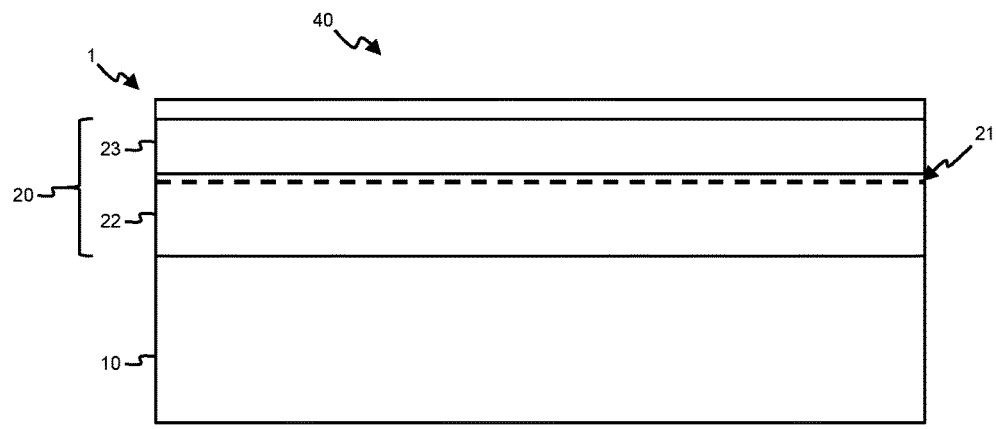
Figure 2C:
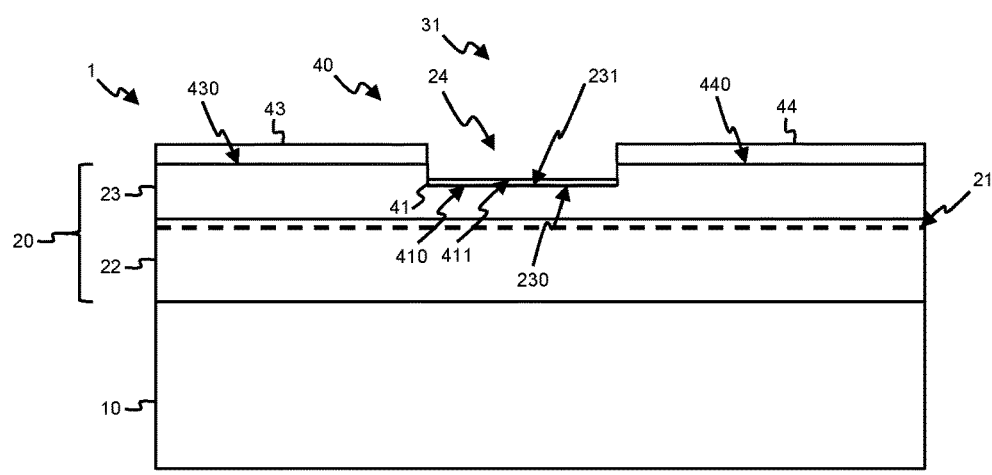

According to an embodiment shown in FIGS. 2A to 2C, a high electron mobility transistor according to the present invention is manufactured as schematically illustrated by the different steps of FIGS. 2A to 2C. On FIG. 2A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The passivation stack 40 is then etched away in a gate region 31 and the second active III-N layer 23 is partially etched in a gate region 31 using the passivation stack 40 as a mask. In other words, a recess 24 is formed in the second active III-N layer 23 in the gate region 31. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. As visible on FIG. 2B, a passivation stack 40 is formed on top of the epitaxial semiconductor layer stack 20. The passivation stack 40 comprises an electron donating dielectric layer. The passivation stack 40 for example comprises SiN. The passivation stack 40 comprises SiN with high density, deposited in-situ in an MOCVD reactor. The SiN may be stochiometric or non-stochiometric. The in-situ SiN may be thickened externally by PECVD or LPCVD SiN or $SiO_x$, for example for thicknesses beyond 500 nm, before any other processing takes place. According to an alternative embodiment, the passivation stack 40 comprises $SiO_2$. According to a further alternative embodiment, the passivation stack 40 of FIG. 2B comprises AlSiN. The Al-doping allows increasing the bandgap of the dielectric material. Alternatively, the passivation stack of FIG. 2B comprise one or more of Si, Al, O and N. The passivation stack 40 is then etched away in a gate region 31, thereby exposing the second passivation surface 230 of the second active III-N layer 23, and thereby forming two electron donating dielectric layers 43;44 on top of the second active III-N layer 23 and on both sides of the gate region 31, such that each of the two electron donating dielectric layers 43;44 comprises a III-N contact surface 430;440 in direct contact with the second active III-N layer 23. According to an alternative embodiment, the second active III-N layer 23 is partially etched in a gate region 31. As visible in FIG. 2C, an electron accepting dielectric layer 41 is then formed in the gate region 31 and extends in the recess 24 of the second active III-N layer 23. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23.

Figure 3A:
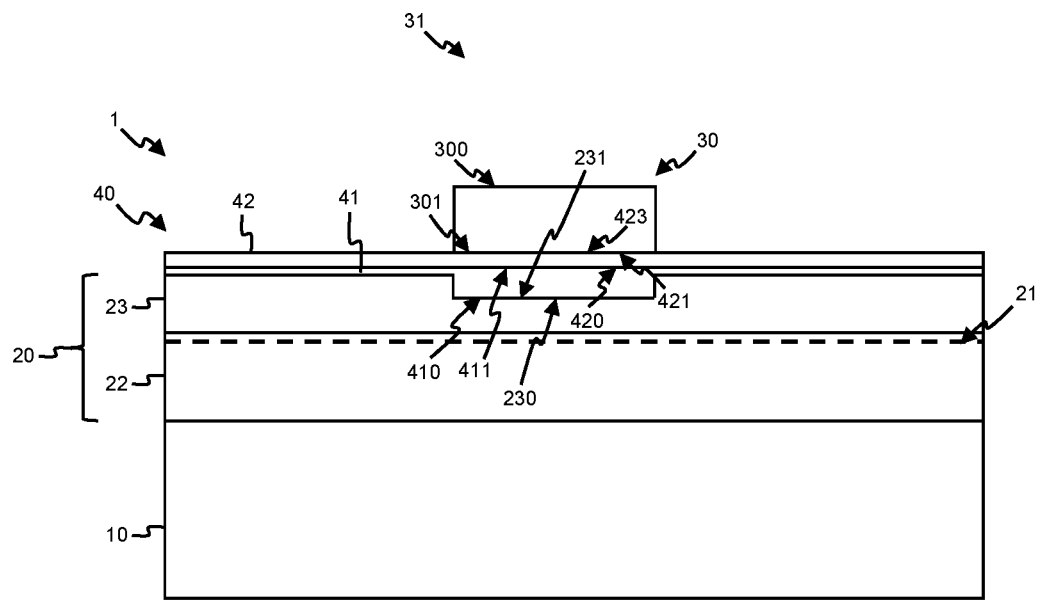
FIGS. 3A and 3B schematically illustrate an embodiment of a high electron mobility transistor according to the present invention, wherein a passivation stack extends fully on top of an epitaxial III-N semiconductor layer stack.
Figure 3B:
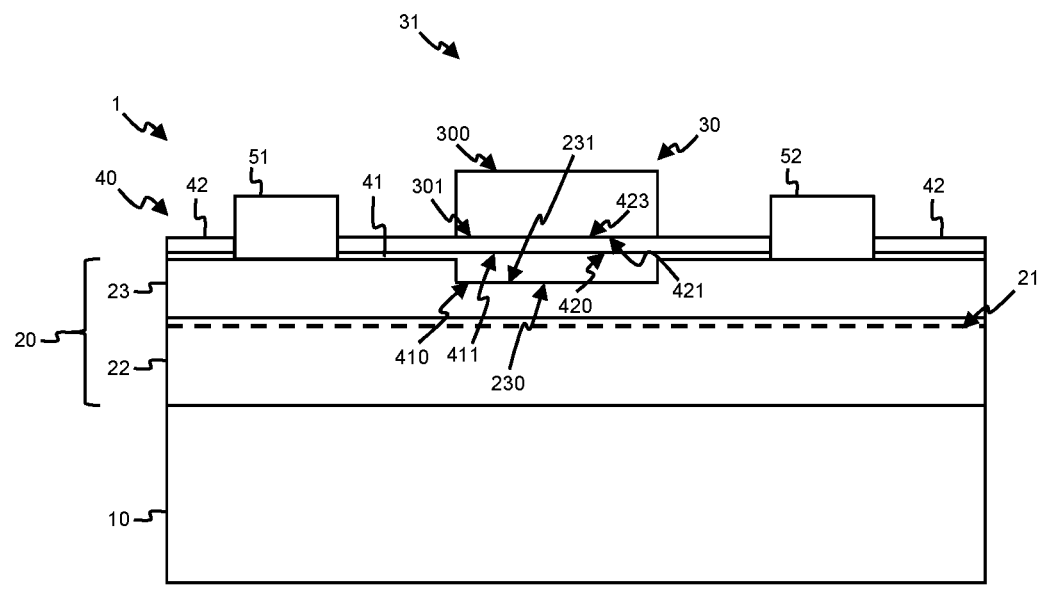

According to an embodiment shown in FIGS. 3A and 3B, a high electron mobility transistor according to the present invention is manufactured as schematically illustrated by the different steps of FIGS. 2A to 2C. Components having identical reference numbers to components in FIG. 2A to 2C perform the same function. As visible in FIG. 3A, a semiconductor structure 1 according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The second active III-N layer 23 is partially etched in a gate region 31. In other words, a recess 24 is formed in the second active III-N layer 23 in the gate region 31. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A passivation stack 40 is formed in FIG. 3A on top of the second active III-N layer 23 by forming an electron accepting dielectric layer 41 and an oxide layer 42. The electron accepting dielectric layer 41 extends in the recess 24 of the second active III-N layer 23 The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with the second passivation surface 230 along the full surface of the second passivation surface 230. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 3A, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 3A, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 10 to 30% of the passivation insulating surface 421. As visible in FIG. 3B, the passivation stack 40 is etched away in a source access region and a drain access region. In other words, the electron accepting dielectric layer 41 and the oxide layer 42 are etched away in a source access region and in a drain access region, thereby exposing the second active III-N layer 23 in a source region 51 and a drain region 52. According to an alternative embodiment, the second active III-N layer 23 is partially etched in a wet etch, for example in an alkaline solution or in resist developer, thereby allowing to form respective ohmic contacts in a source region 51 and in a drain region 52 partly in the second active III-N layer 23. Once the areas of the ohmic contacts are defined, i.e. when the source region 51 and the drain region 52 have been defined, a metal layer or a stack of metal layers can be deposited, for example by thermal evaporation, or by sputtering, or by e-beam evaporation. Metal patterns are consecutively defined by performing lift-off of the metal, on top of the photoresist and not in contact with the second active III-N layer 23. Alternatively, the photoresist is first removed and the metal stack comprising for example Ti and Al is deposited and then a second photoresist deposition and photolithography steps are performed to allow dry etching of the metal stack in areas where it is unwanted and removing the photoresist. The defined ohmic contacts may then be subjected to one or more alloying steps, for example a rapid thermal annealing step for a duration of one minute in a reduced or inert atmosphere such as for example hydrogen or forming gas or nitrogen gas at a temperature for example between 800° C. and 900° C. A high electron mobility transistor 1 according to the present invention is obtained.

Figure 4A:
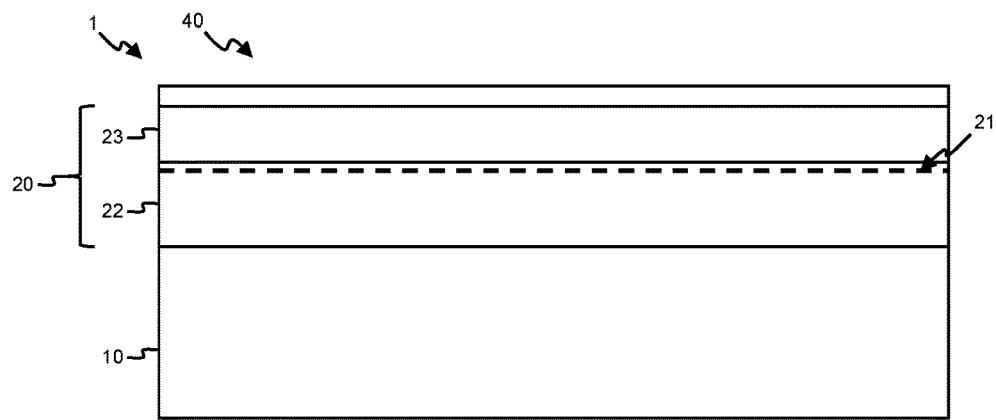
FIGS. 4A to 4C schematically illustrate an embodiment of a high electron mobility transistor according to the present invention, wherein an electron accepting dielectric layer is deposited on top of a partial recess in FIG. 4B or a full recess in FIG. 4C formed in a second active III-N layer of an epitaxial III-N semiconductor layer stack.
Figure 4B:
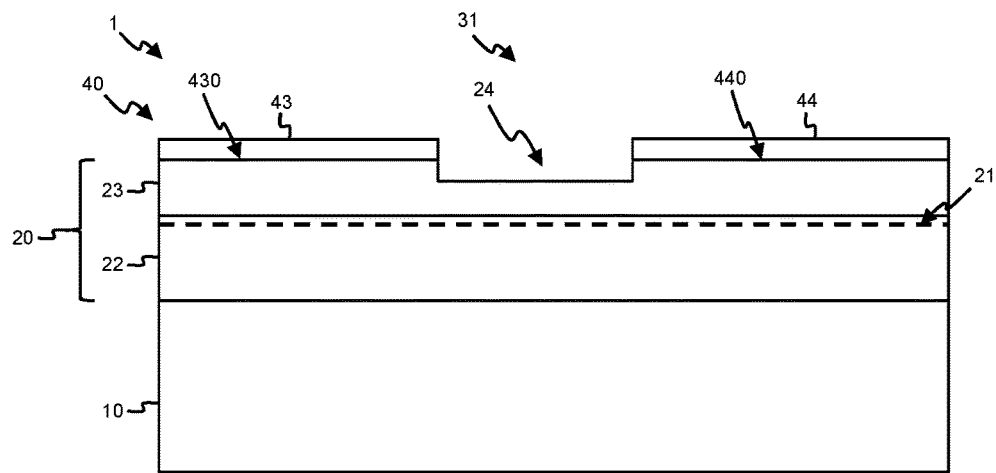
Figure 4C:
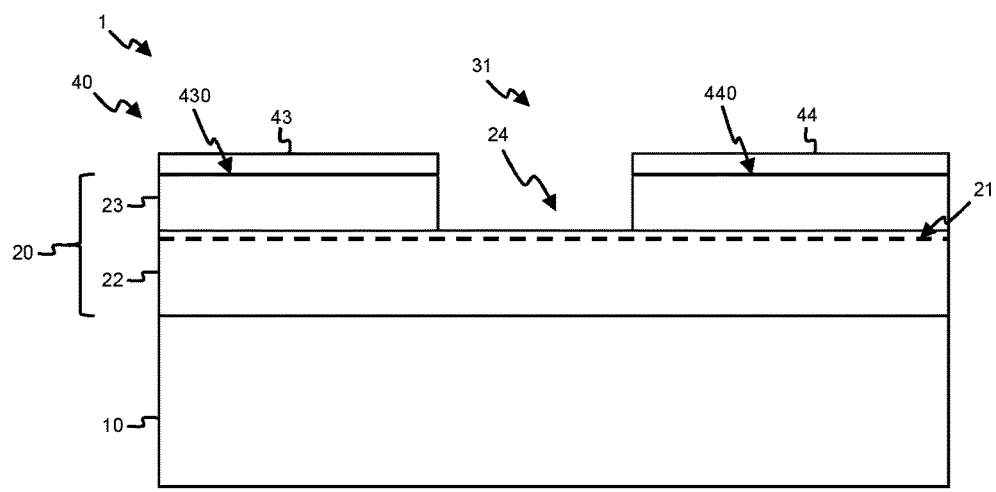

According to an embodiment shown in FIGS. 4A and 4B, a high electron mobility transistor according to the present invention is manufactured as schematically illustrated by the different steps of FIGS. 4A and 4B. Components having identical reference numbers to components in FIG. 2A to 2C and FIGS. 3A and 3B perform the same function. As visible in FIG. 4A, a semiconductor structure 1 according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio $(Al_xGa_yN)$ wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A passivation stack 40 is formed on top of the epitaxial III-N semiconductor layer stack 20, and more particularly on top of the second active III-N layer 23. The passivation stack 40 for example comprises SiN. The passivation stack 40 comprises SiN with high density, deposited in-situ in an MOCVD reactor. The SiN may be stochiometric or non-stochiometric. The in-situ SiN may be thickened externally by PECVD or LPCVD SiN or $SiO_x$, for example for thicknesses beyond 500 nm, before any other processing takes place. According to an alternative embodiment, the passivation stack 40 comprises $SiO_2$. According to a further alternative embodiment, the passivation stack 40 of FIG. 4A comprises AlSiN. The Al-doping allows increasing the bandgap of the dielectric material. Alternatively, the passivation stack of FIG. 4A comprise one or more of Si, Al, O and N. The passivation stack 40 is then etched away in a gate region 31 and the second active III-N layer 23 is partially etched in a gate region 31 on FIG. 4B using the passivation stack 40 as a mask. In other words, a recess 24 is formed in the second active III-N layer 23 in the gate region 31. According to an alternative embodiment depicted in FIG. 4C, the passivation stack 40 is then etched away in a gate region 31 and the second active III-N layer 23 is fully etched away in a gate region 31 on FIG. 4C using the passivation stack 40 as a mask. In other words, a recess 24 is formed in the second active III-N layer 23 in the gate region 31 and completely extends through the second active III-N layer 23 in the gate region 31, thereby exposing the first active III-N layer 22. This can be achieved by etching in a plasma etching tool such as Reactive Ion Etching or RIE or preferably in an Inductively Coupled Plasma or ICP tool.

The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma.

Figure 5A:
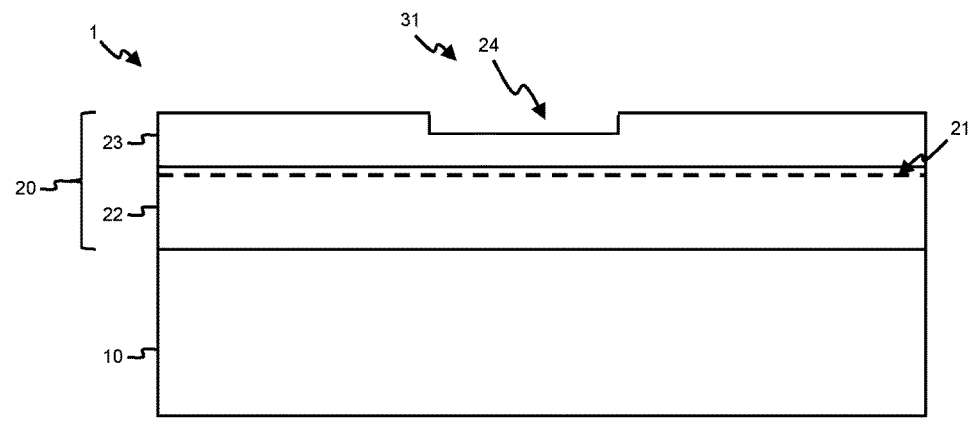
FIG. 5A to 5C schematically illustrate an embodiment of a semiconductor structure according to the present invention, wherein said semiconductor structure comprises a partial recess formed in a second active III-N layer.
Figure 5B:
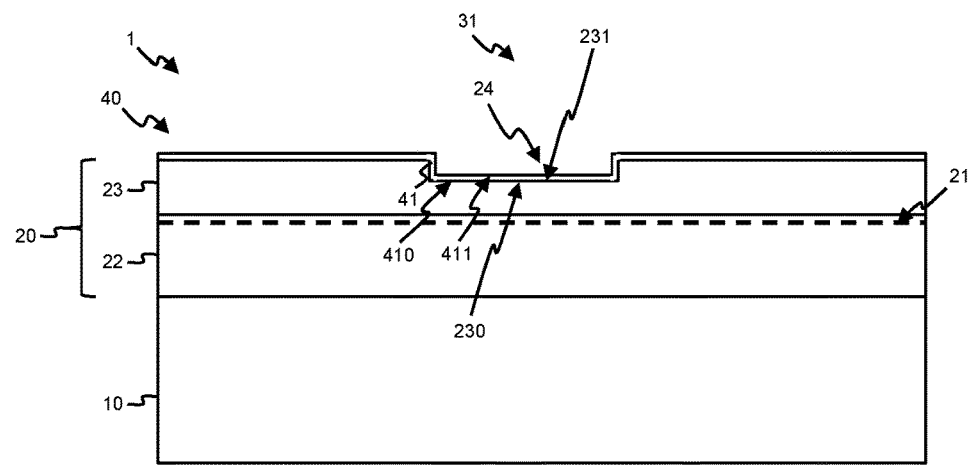
Figure 5C:
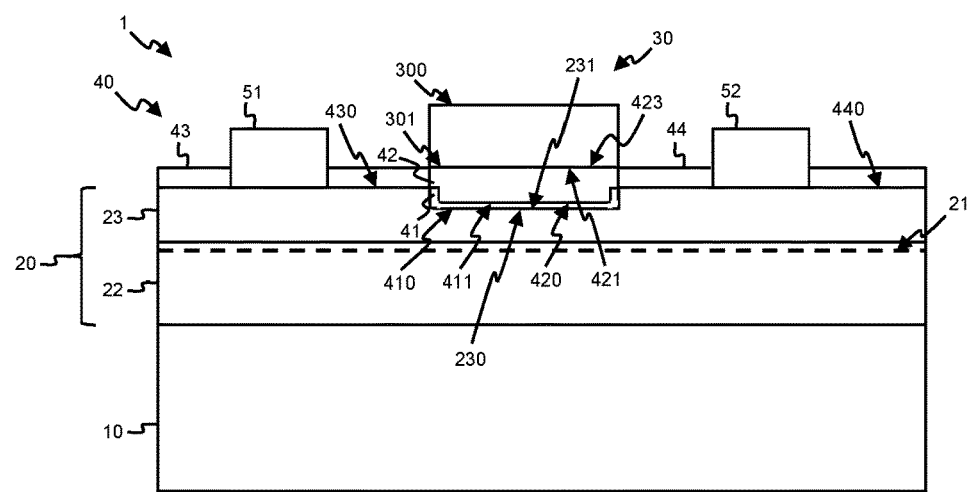

According to an embodiment shown in FIGS. 5A to 5C, a high electron mobility transistor according to the present invention is manufactured as schematically illustrated by the different steps of FIGS. 5A to 5C. Components having identical reference numbers to components in FIG. 2A to 2C and FIGS. 3A and 3B and FIGS. 4A to 4C perform the same function. As visible in FIG. 5A, a semiconductor structure 1 according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A passivation stack is formed on top of the epitaxial III-N semiconductor layer stack 20, and more particularly on top of the second active III-N layer 23. The passivation stack for example comprises SiN. The passivation stack comprises SiN with high density, deposited in-situ in an MOCVD reactor. The SiN may be stochiometric or non-stochiometric. The in-situ SiN may be thickened externally by PECVD or LPCVD SiN or $SiO_x$, for example for thicknesses beyond 500 nm, before any other processing takes place. According to an alternative embodiment, the passivation stack comprises $SiO_2$. According to a further alternative embodiment, the passivation stack comprises AlSiN. The Al-doping allows increasing the bandgap of the dielectric material. Alternatively, the passivation stack comprises one or more of Si, Al, O and N. The passivation stack is then etched away in a gate region 31 and the second active III-N layer 23 is partially etched in a gate region 31 on FIG. 5A using the passivation stack as a mask, thereby forming a recess 24 in the second active III-N layer 23. In other words, a partial recess 24 is formed in the second active III-N layer 23 in the gate region 31. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An electron accepting dielectric layer 41 is then formed on top of the second active III-N layer 23 of FIG. 5A, thereby being formed in the recess 24 of the second active III-N layer 23. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. According to an alternative embodiment, a passivation stack is deposited on top of the second active III-N layer 23 similarly to FIG. 2A to 2C, the passivation stack is then etched away in the gate region 31 and the electron accepting dielectric layer 41 is then deposited in the gate region 31 in the partial recess 24, thereby forming the high electron mobility transistor of FIG. 5C. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 5C, the passivation stack 40 further comprises an oxide layer 42. The oxide layer 42 also partially extends in the recess 24 formed in the second active III-N layer 23. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 5C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. As shown on FIG. 5C, the passivation stack 40 further comprises two electron donating dielectric layers 43;44 formed on top of the second active III-N layer 23 and on both sides of the electron accepting dielectric layer 41, i.e. on both sides of the gate region 31, such that each of the two electron donating dielectric layers 43;44 comprises a III-N contact surface 430;440 in direct contact with the second active III-N layer 23. The electron donating dielectric layers 43;44 comprise SiN with high density, deposited in-situ in an MOCVD reactor. The SiN may be stochiometric or non-stochiometric. It has been shown experimentally by inventors that for example a HEMT structure that is capped with in-situ SiN is not affected by processing steps, even those that have a high temperature budget. According to an alternative embodiment, the electron donating dielectric layers 43;44 comprise AlSiN. The Al-doping allows increasing the bandgap of the dielectric material. According to a further alternative embodiment, the electron donating dielectric layers 43;44 comprise one or more of Si, Al, O and N. The electron donating dielectric layers 43;44 have a thickness of 1 to 500 nm, preferably 30 to 400 nm, more preferably 50 to 300 nm, such as 100 to 200 nm. The in-situ SiN may be thickened externally by PECVD or LPCVD SiN or $SiO_x$, for example for thicknesses beyond 500 nm, before any other processing takes place. On FIG. 5C, the two electron donating dielectric layers 43;44 are as thick as the stack of the electron accepting dielectric layer 41 and of the oxide layer 42. According to an alternative embodiment, the two electron donating dielectric layers 43;44 encapsulate the high electron mobility transistor and the two electric donating dielectric layer are etched away in a gate region, and are etched away in a gate access region and a drain access region wherein a source and a drain are then formed. According to an alternative embodiment, the two electron donating dielectric layers 43;44 are thicker than the stack of the electron accepting dielectric layer 41 and the oxide layer 42. Finally, on FIG. 5C, the passivation stack 40 is etched away in a source access region and is etched away in a drain access region. More particularly, the two electron donating dielectric layers 43;44 of the passivation stack 40 are etched away respectively in a source region 51 and in a drain region 52. An ohmic contact is then formed in the source region 51 and an ohmic contact is then formed in the drain region 52. Forming an ohmic contact in the source region 51 and forming an ohmic contact in the drain region 52 comprise plurality of process steps. For example, this is done by starting with depositing photoresist and defining the respective areas of the respective ohmic contacts with a lithography step. The electron donating dielectric layers 43;44 are then partially or fully removed respectively in a source region 51 and in a drain region 52. For example, the electron donating dielectric layers 43;44 can be removed by wet etching in HF or buffered HF or by dry etching in a RIE or ICP plasma tool in a fluorine chemistry. Both dry and wet etches of the electron donating dielectric layers 43;44 in a fluorine chemistry will stop on the second active III-N layer 23 which acts as an etch-stop with very high selectivity. For example, the etch of the electron donating dielectric layers 43;44 is done in a dry etching system based on fluorine chemistry such as for example in an inductively coupled plasma system using $SF_6$ or $CF_4$ as etching gas and RF, or "platen", and ICP, or "coil" etching powers of 10 W to 150 W respectively. This allows for thorough removal of the remaining electron donating dielectric layer 43;44 without removing the second active III-N layer 23 or any of the layers below. According to an alternative embodiment, the second active III-N layer 23 is partially etched in a wet etch, for example in an alkaline solution or in resist developer, thereby allowing to form respective ohmic contacts in a source region 51 and in a drain region 52 partly in the second active III-N layer 23. Once the areas of the ohmic contacts are defined, i.e. when the source region 51 and the drain region 52 have been defined, a metal layer or a stack of metal layers can be deposited, for example by thermal evaporation, or by sputtering, or by e-beam evaporation. Metal patterns are consecutively defined by performing lift-off of the metal, on top of the photoresist and not in contact with the second active III-N layer 23. Alternatively, the photoresist is first removed and the metal stack comprising for example Ti and Al is deposited and then a second photoresist deposition and photolithography steps are performed to allow dry etching of the metal stack in areas where it is unwanted and removing the photoresist. The defined ohmic contacts may then be subjected to one or more alloying steps, for example a rapid thermal annealing step for a duration of one minute in a reduced or inert atmosphere such as for example hydrogen or forming gas or nitrogen gas at a temperature for example between 800° C. and 900° C. A high electron mobility transistor 1 according to the present invention is obtained.

Figure 6A:
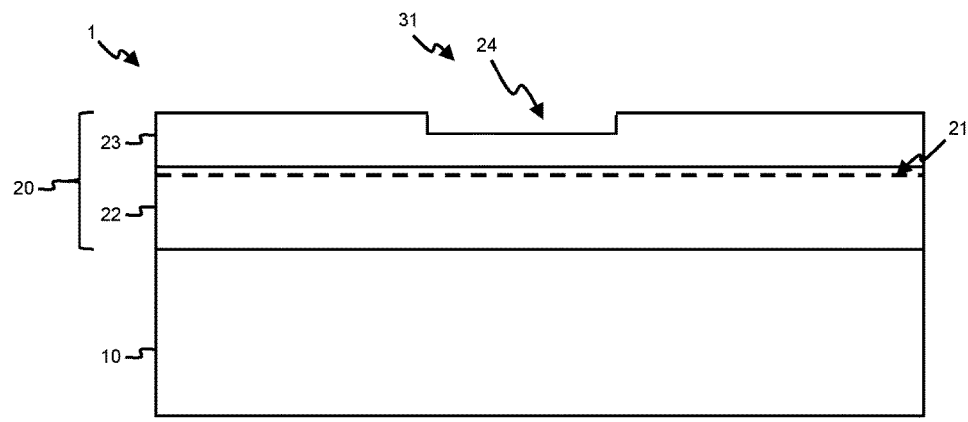
FIGS. 6A to 6C schematically illustrate an embodiment of a semiconductor structure according to the present invention, wherein said electron accepting dielectric layer is deposited in a gate region after etching a passivation stack in said gate region, and wherein said semiconductor structure comprises a recess formed in a second active III-N layer.
Figure 6B:
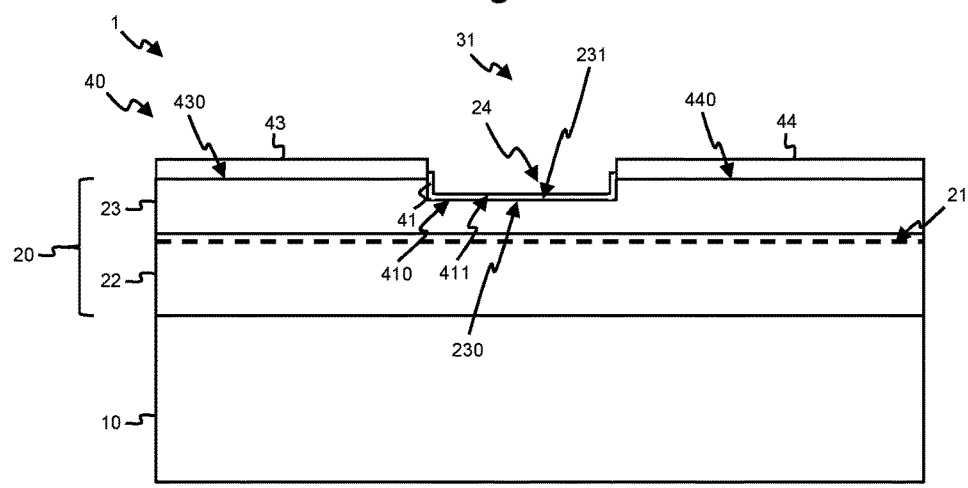
Figure 6C:
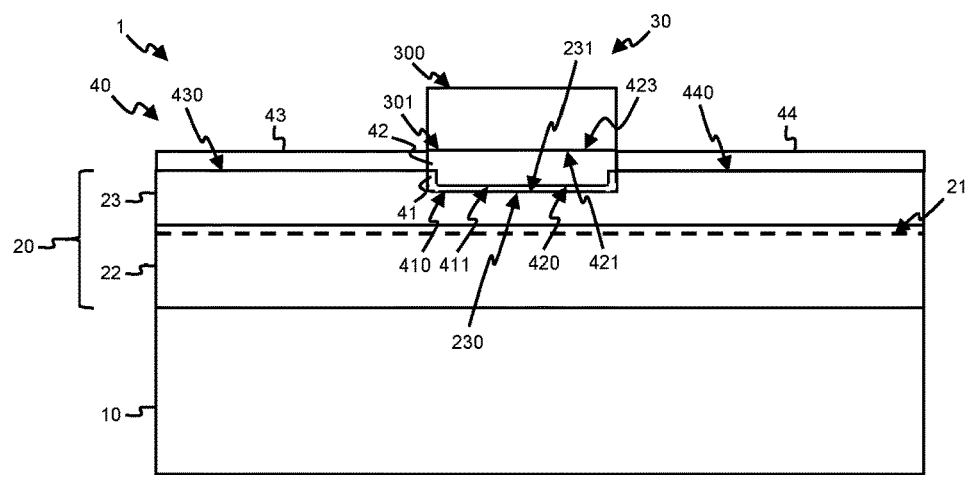

According to an embodiment shown in FIGS. 6A to 6C, a high electron mobility transistor according to the present invention is manufactured as schematically illustrated by the different steps of FIGS. 2A to 2C. Components having identical reference numbers to components in FIG. 2A to 2C and FIGS. 3A and 3B and FIGS. 4A to 4C and FIG. 5A to 5C perform the same function. FIGS. 6A to 6C illustrate an alternative manufacturing method of a semiconductor structure 1 according to the present invention. On FIG. 6A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. As visible on FIG. 6B, a passivation stack 40 is formed on top of the epitaxial semiconductor layer stack 20. The passivation stack 40 comprises an electron donating dielectric layer. The passivation stack 40 for example comprises SiN. The passivation stack 40 comprises SiN with high density, deposited in-situ in an MOCVD reactor. The SiN may be stochiometric or non-stochiometric. The in-situ SiN may be thickened externally by PECVD or LPCVD SiN or $SiO_x$, for example for thicknesses beyond 500 nm, before any other processing takes place. According to an alternative embodiment, the passivation stack 40 comprises $SiO_2$. According to a further alternative embodiment, the passivation stack 40 of FIG. 6B comprises AlSiN. The Al-doping allows increasing the bandgap of the dielectric material. Alternatively, the passivation stack of FIG. 6B comprise one or more of Si, Al, O and N. The passivation stack 40 is then etched away in a gate region 31, thereby exposing the second passivation surface 230 of the second active III-N layer 23, and thereby forming two electron donating dielectric layers 43;44 on top of the second active III-N layer 23 and on both sides of the gate region 31, such that each of the two electron donating dielectric layers 43;44 comprises a III-N contact surface 430;440 in direct contact with the second active III-N layer 23. The second active III-N layer 23 is partially etched in a gate region 31 on FIG. 6B using the passivation stack as a mask, thereby forming a recess 24 in the second active III-N layer 23. In other words, a partial recess 24 is formed in the second active III-N layer 23 in the gate region 31. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. As visible in FIG. 6B, an electron accepting dielectric layer 41 is then formed in the gate region 31. According to an alternative embodiment, the electron accepting dielectric layer 41 is deposited over the two electron donating dielectric layers 43;44 and over the recess 24 in the gate region and the electron accepting dielectric layer 41 is then etched away except in the gate region 31, thereby remaining in the recess 24 as depicted in FIG. 6C. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. The thickness of the electron accepting dielectric layer is lower than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 6C, the passivation stack 40 further comprises an oxide layer 42. The oxide layer 42 also partially extends in the recess 24 formed in the second active III-N layer 23. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 6C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. As shown on FIG. 6C, the passivation stack 40 further comprises two electron donating dielectric layers 43;44 formed on top of the second active III-N layer 23 and on both sides of the electron accepting dielectric layer 41, i.e. on both sides of the gate region 31, such that each of the two electron donating dielectric layers 43;44 comprises a III-N contact surface 430;440 in direct contact with the second active III-N layer 23. The electron donating dielectric layers 43;44 comprise SiN with high density, deposited in-situ in an MOCVD reactor. The SiN may be stochiometric or non-stochiometric. It has been shown experimentally by inventors that for example a HEMT structure that is capped with in-situ SiN is not affected by processing steps, even those that have a high temperature budget. According to an alternative embodiment, the electron donating dielectric layers 43;44 comprise AlSiN. The Al-doping allows increasing the bandgap of the dielectric material. According to a further alternative embodiment, the electron donating dielectric layers 43;44 comprise one or more of Si, Al, O and N. The electron donating dielectric layers 43;44 have a thickness of 1 to 500 nm, preferably 30 to 400 nm, more preferably 50 to 300 nm, such as 100 to 200 nm. The in-situ SiN may be thickened externally by PECVD or LPCVD SiN or $SiO_x$, for example for thicknesses beyond 500 nm, before any other processing takes place. On FIG. 6C, the two electron donating dielectric layers 43;44 are as thick as the stack of the electron accepting dielectric layer 41 and of the oxide layer 42. According to an alternative embodiment, the two electron donating dielectric layers 43;44 encapsulate the high electron mobility transistor and the two electric donating dielectric layer are etched away in a gate region, and are etched away in a gate access region and a drain access region wherein a source and a drain are then formed. According to an alternative embodiment, the two electron donating dielectric layers 43;44 are thicker than the stack of the electron accepting dielectric layer 41 and the oxide layer 42. Finally, on FIG. 6C, the passivation stack 40 is etched away in a source access region and is etched away in a drain access region. More particularly, the two electron donating dielectric layers 43;44 of the passivation stack 40 are etched away respectively in a source region 51 and in a drain region 52. An ohmic contact is then formed in the source region 51 and an ohmic contact is then formed in the drain region 52. Forming an ohmic contact in the source region 51 and forming an ohmic contact in the drain region 52 comprise plurality of process steps. For example, this is done by starting with depositing photoresist and defining the respective areas of the respective ohmic contacts with a lithography step. The electron donating dielectric layers 43;44 are then partially or fully removed respectively in a source region 51 and in a drain region 52. For example, the electron donating dielectric layers 43;44 can be removed by wet etching in HF or buffered HF or by dry etching in a RIE or ICP plasma tool in a fluorine chemistry. Both dry and wet etches of the electron donating dielectric layers 43;44 in a fluorine chemistry will stop on the second active III-N layer 23 which acts as an etch-stop with very high selectivity. For example, the etch of the electron donating dielectric layers 43;44 is done in a dry etching system based on fluorine chemistry such as for example in an inductively coupled plasma system using $SF_6$ or $CF_4$ as etching gas and RF, or "platen", and ICP, or "coil" etching powers of 10 W to 150 W respectively. This allows for thorough removal of the remaining electron donating dielectric layer 43;44 without removing the second active III-N layer 23 or any of the layers below. According to an alternative embodiment, the second active III-N layer 23 is partially etched in a wet etch, for example in an alkaline solution or in resist developer, thereby allowing to form respective ohmic contacts in a source region 51 and in a drain region 52 partly in the second active III-N layer 23. Once the areas of the ohmic contacts are defined, i.e. when the source region 51 and the drain region 52 have been defined, a metal layer or a stack of metal layers can be deposited, for example by thermal evaporation, or by sputtering, or by e-beam evaporation. Metal patterns are consecutively defined by performing lift-off of the metal, on top of the photoresist and not in contact with the second active III-N layer 23. Alternatively, the photoresist is first removed and the metal stack comprising for example Ti and Al is deposited and then a second photoresist deposition and photolithography steps are performed to allow dry etching of the metal stack in areas where it is unwanted and removing the photoresist. The defined ohmic contacts may then be subjected to one or more alloying steps, for example a rapid thermal annealing step for a duration of one minute in a reduced or inert atmosphere such as for example hydrogen or forming gas or nitrogen gas at a temperature for example between 800° C. and 900° C. A high electron mobility transistor 1 according to the present invention is obtained.

Figure 7A:
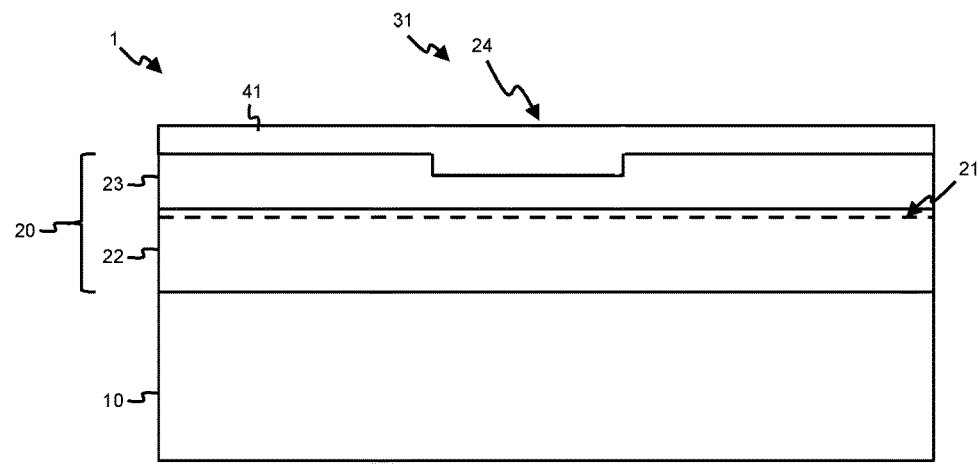
FIGS. 7A to 7C schematically illustrate an embodiment of a high electron mobility transistor according to the present invention.
Figure 7B:
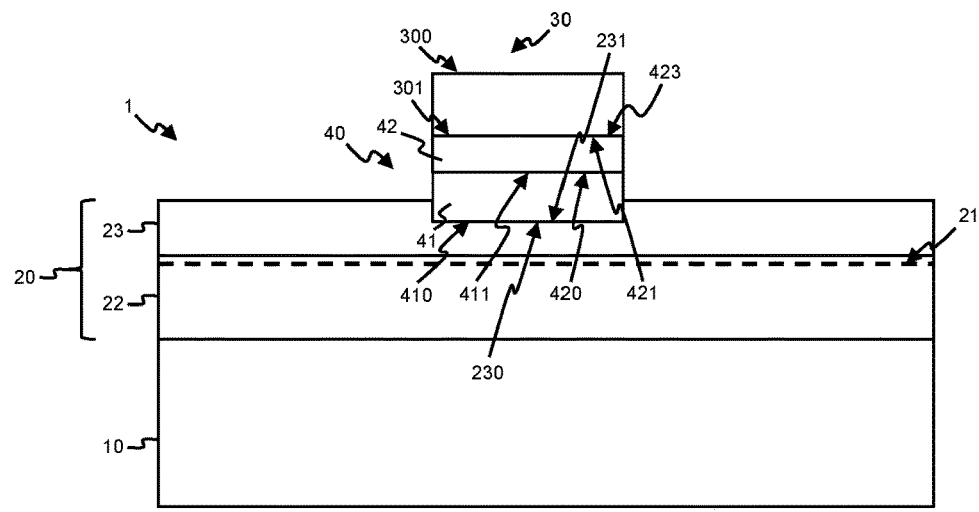
Figure 7C:
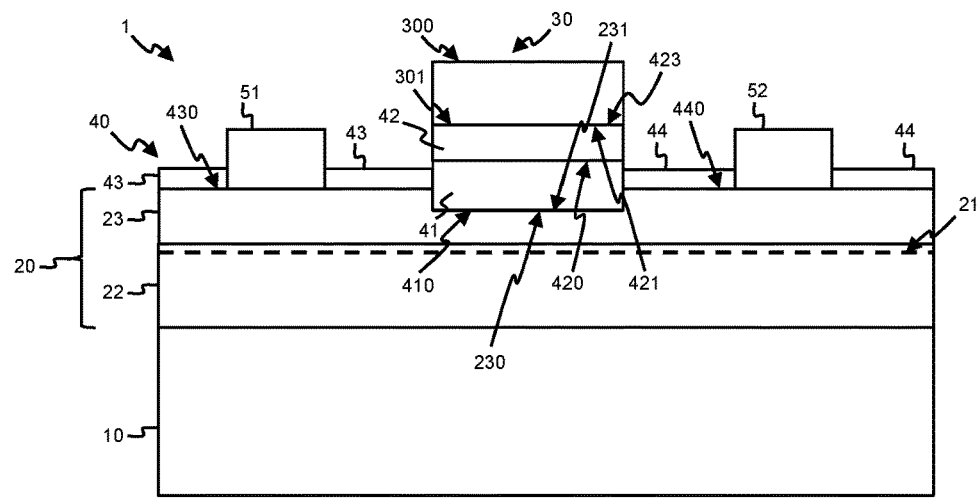

According to an embodiment shown in FIGS. 7A to 7C, a high electron mobility transistor according to the present invention is manufactured as schematically illustrated by the different steps of FIGS. 7A to 7C. Components having identical reference numbers to components in FIG. 2A to 2C and FIGS. 3A and 3B and FIGS. 4A to 4C and FIGS. 5A to 5C and FIGS. 6A to 6C perform the same function. As visible in FIG. 7A, a semiconductor structure 1 according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A partial recess 24 is formed in the second active III-N layer 23 in a gate region 31. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An electron accepting dielectric layer 41 is formed on top of the epitaxial III-N semiconductor layer stack 20, and more particularly on top of the second active III-N layer 23, thereby being formed in the recess 24 of the second active III-N layer 23. According to an alternative embodiment, a mask is deposited in the second active III-N layer 23 and the mask is etched away in the gate region 31. The electron accepting dielectric layer 41 is then formed in the gate region 31, as depicted in FIG. 7B. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. The thickness of the electron accepting dielectric layer is larger than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 7B, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 7B, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. As shown on FIG. 7B, the passivation stack 40 further comprises two electron donating dielectric layers 43;44 formed on top of the second active III-N layer 23 and on both sides of the electron accepting dielectric layer 41, i.e. on both sides of the gate region 31, such that each of the two electron donating dielectric layers 43;44 comprises a III-N contact surface 430;440 in direct contact with the second active III-N layer 23. The electron donating dielectric layers 43;44 comprise SiN with high density, deposited in-situ in an MOCVD reactor. The SiN may be stochiometric or non-stochiometric. It has been shown experimentally by inventors that for example a HEMT structure that is capped with in-situ SiN is not affected by processing steps, even those that have a high temperature budget. According to an alternative embodiment, the electron donating dielectric layers 43;44 comprise AlSiN. The Al-doping allows increasing the bandgap of the dielectric material. According to a further alternative embodiment, the electron donating dielectric layers 43;44 comprise one or more of Si, Al, O and N. The electron donating dielectric layers 43;44 have a thickness of 1 to 500 nm, preferably 30 to 400 nm, more preferably 50 to 300 nm, such as 100 to 200 nm. The in-situ SiN may be thickened externally by PECVD or LPCVD SiN or $SiO_x$, for example for thicknesses beyond 500 nm, before any other processing takes place. On FIG. 7C, the two electron donating dielectric layers 43;44 are as thick as the stack of the electron accepting dielectric layer 41 and of the oxide layer 42. According to an alternative embodiment, the two electron donating dielectric layers 43;44 encapsulate the high electron mobility transistor and the two electric donating dielectric layer are etched away in a gate region, and are etched away in a gate access region and a drain access region wherein a source and a drain are then formed. According to an alternative embodiment, the two electron donating dielectric layers 43;44 are thicker than the stack of the electron accepting dielectric layer 41 and the oxide layer 42. Finally, on FIG. 7B, the passivation stack 40 is etched away in a source access region and is etched away in a drain access region. More particularly, the two electron donating dielectric layers 43;44 of the passivation stack 40 are etched away respectively in a source region 51 and in a drain region 52. An ohmic contact is then formed in the source region 51 and an ohmic contact is then formed in the drain region 52. Forming an ohmic contact in the source region 51 and forming an ohmic contact in the drain region 52 comprise plurality of process steps. For example, this is done by starting with depositing photoresist and defining the respective areas of the respective ohmic contacts with a lithography step. The electron donating dielectric layers 43;44 are then partially or fully removed respectively in a source region 51 and in a drain region 52. For example, the electron donating dielectric layers 43;44 can be removed by wet etching in HF or buffered HF or by dry etching in a RIE or ICP plasma tool in a fluorine chemistry. Both dry and wet etches of the electron donating dielectric layers 43;44 in a fluorine chemistry will stop on the second active III-N layer 23 which acts as an etch-stop with very high selectivity. For example, the etch of the electron donating dielectric layers 43;44 is done in a dry etching system based on fluorine chemistry such as for example in an inductively coupled plasma system using $SF_6$ or $CF_4$ as etching gas and RF, or "platen", and ICP, or "coil" etching powers of 10 W to 150 W respectively. This allows for thorough removal of the remaining electron donating dielectric layer 43;44 without removing the second active III-N layer 23 or any of the layers below. According to an alternative embodiment, the second active III-N layer 23 is partially etched in a wet etch, for example in an alkaline solution or in resist developer, thereby allowing to form respective ohmic contacts in a source region 51 and in a drain region 52 partly in the second active III-N layer 23. Once the areas of the ohmic contacts are defined, i.e. when the source region 51 and the drain region 52 have been defined, a metal layer or a stack of metal layers can be deposited, for example by thermal evaporation, or by sputtering, or by e-beam evaporation. Metal patterns are consecutively defined by performing lift-off of the metal, on top of the photoresist and not in contact with the second active III-N layer 23. Alternatively, the photoresist is first removed and the metal stack comprising for example Ti and Al is deposited and then a second photoresist deposition and photolithography steps are performed to allow dry etching of the metal stack in areas where it is unwanted and removing the photoresist. The defined ohmic contacts may then be subjected to one or more alloying steps, for example a rapid thermal annealing step for a duration of one minute in a reduced or inert atmosphere such as for example hydrogen or forming gas or nitrogen gas at a temperature for example between 800° C. and 900° C. A high electron mobility transistor 1 according to the present invention is obtained.

Figure 8A:
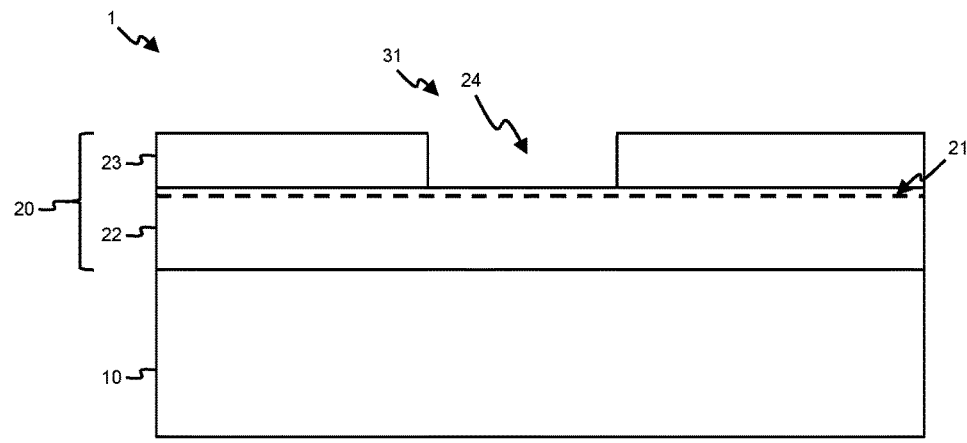
FIG. 8A to 8C schematically illustrate an embodiment of a semiconductor structure according to the present invention, wherein said semiconductor structure comprises a full recess formed in a second active III-N layer.
Figure 8B:
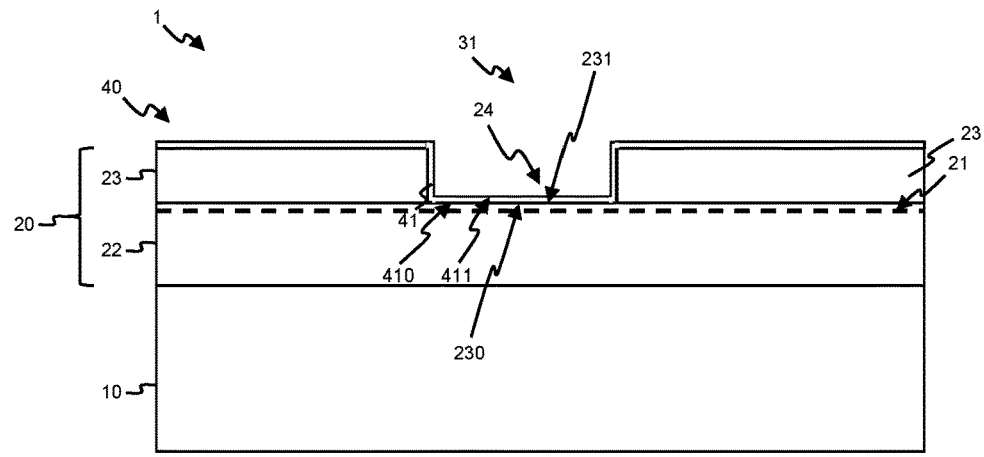
Figure 8C:
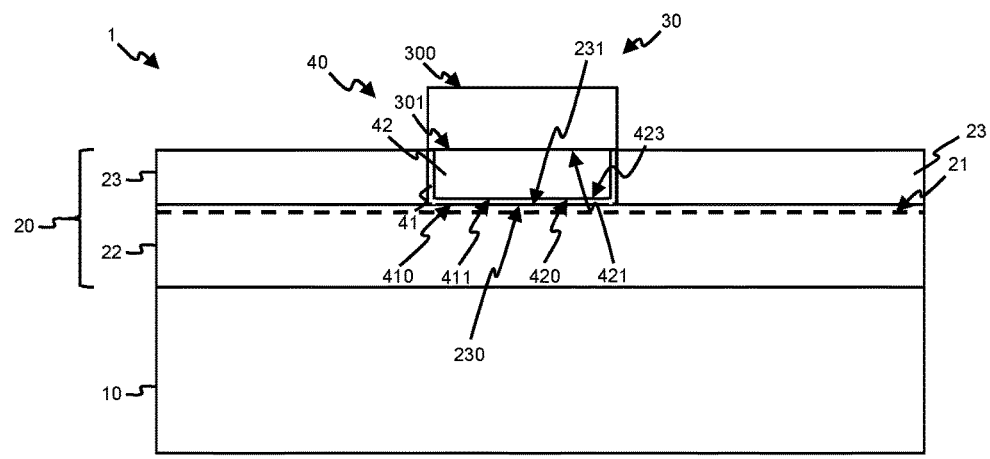

According to an embodiment shown in FIGS. 8A to 8C, a high electron mobility transistor according to the present invention is manufactured as schematically illustrated by the different steps of FIGS. 8A to 8C. Components having identical reference numbers to components in FIG. 2A to 2C and FIGS. 3A and 3B and FIGS. 4A to 4C and FIGS. 5A to 5C and FIGS. 6A to 6C and FIGS. 7A to 7C perform the same function. As visible in FIG. 8A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A full recess 24 is formed in the second active III-N layer 23 in a gate region 31, thereby exposing the first active III-N layer 22. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An electron accepting dielectric layer 41 is formed on top of the epitaxial III-N semiconductor layer stack 20, and more particularly on top of the second active III-N layer 23, thereby being formed in the recess 24 of the second active III-N layer 23. According to an alternative embodiment, a mask is deposited on top of the second active III-N layer 23 and the mask is etched away in the gate region 31. The electron accepting dielectric layer 41 is then formed in the gate region 31 as depicted in FIG. 8C. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. The thickness of the electron accepting dielectric layer is smaller than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 8C, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof.

According to a further alternative embodiment, the oxide layer 42 comprises a gate dielectric such as for example HfOx, ZrOx, etc. The oxide layer 42 also extends in the recess 24 formed in the second active III-N layer 23. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 8C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. Ohmic contacts could be formed in a source region and a drain region as described in FIG. 8C, thereby forming a metal-oxide-semiconductor field-effect transistor 1.

Figure 9A:
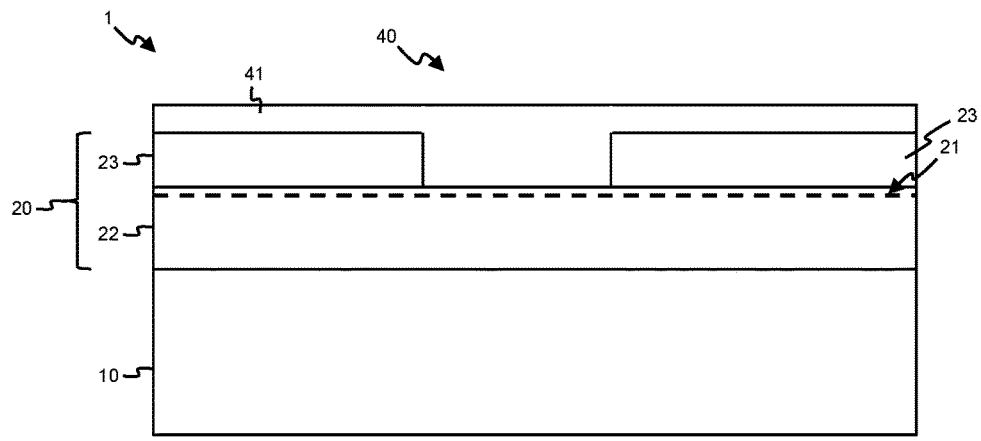
FIG. 9A to 9C schematically illustrate an embodiment of a high electron mobility transistor according to the present invention, wherein said high electron mobility transistor comprises a full recess formed in a second active III-N layer.
Figure 9B:
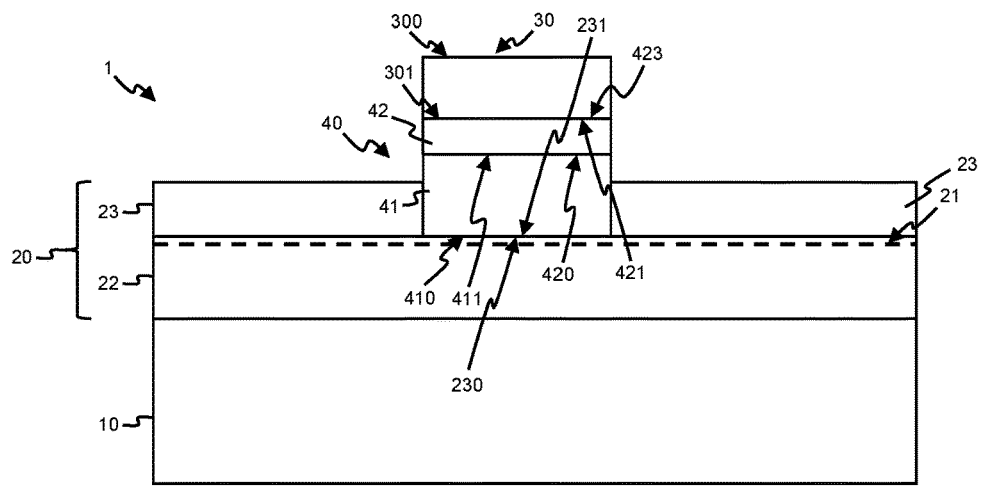
Figure 9C:
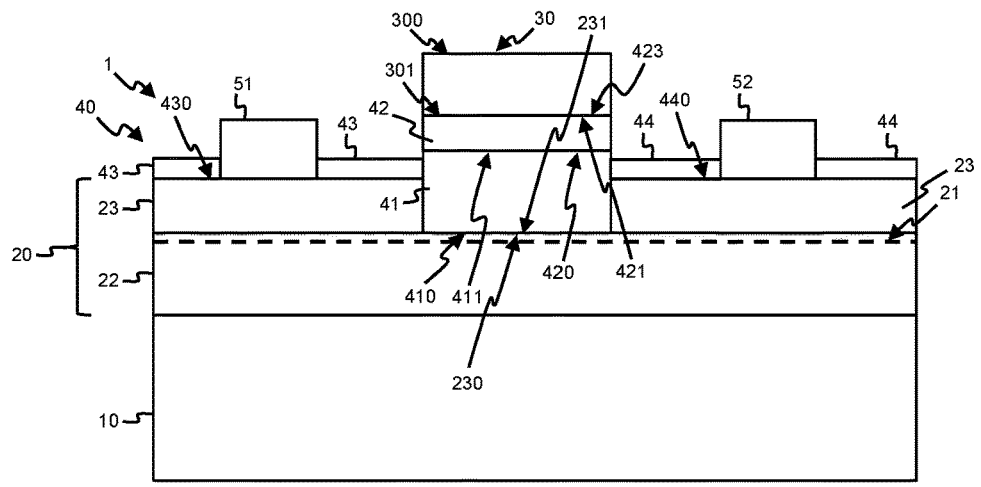

According to an embodiment shown in FIGS. 9A to 9C, a high electron mobility transistor according to the present invention is manufactured as schematically illustrated by the different steps of FIGS. 9A to 9C. Components having identical reference numbers to components in FIG. 2A to 2C and FIGS. 3A and 3B and FIGS. 4A to 4C and FIGS. 5A to 5C and FIGS. 6A to 6C and FIGS. 7A to 7C perform the same function. As visible in FIG. 9A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Ti. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A full recess 24 is formed in the second active III-N layer 23 in a gate region 31, thereby exposing the first active III-N layer 22. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An electron accepting dielectric layer 41 is formed on top of the epitaxial III-N semiconductor layer stack 20, and more particularly on top of the second active III-N layer 23, thereby being formed in the recess 24 of the second active III-N layer 23. According to an alternative embodiment, a mask is deposited on top of the second active III-N layer 23 and the mask is etched away in the gate region 31. The electron accepting dielectric layer 41 is then formed in the gate region 31 as depicted in FIG. 9B. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. The thickness of the electron accepting dielectric layer is larger than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 9C, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 9C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. Ohmic contacts could be formed in a source region and a drain region as described in FIG. 9C, thereby forming a metal-oxide-semiconductor field-effect transistor 1.

Figure 10A:
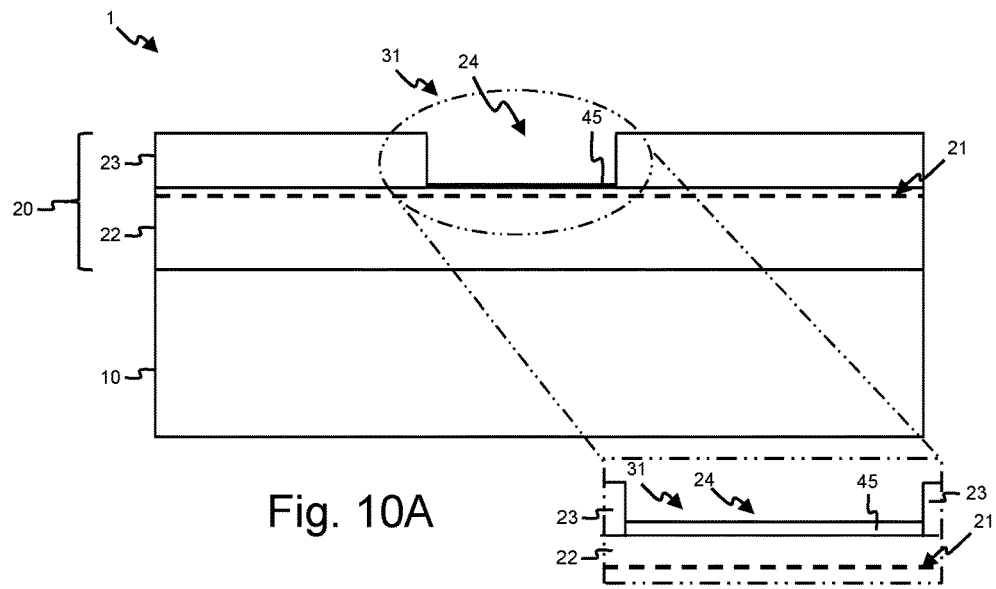
FIG. 10A to 10C schematically illustrate an embodiment of a semiconductor structure according to the present invention, wherein said semiconductor structure comprises a full recess formed in a second active III-N layer and further comprises an AlN layer.
Figure 10B:
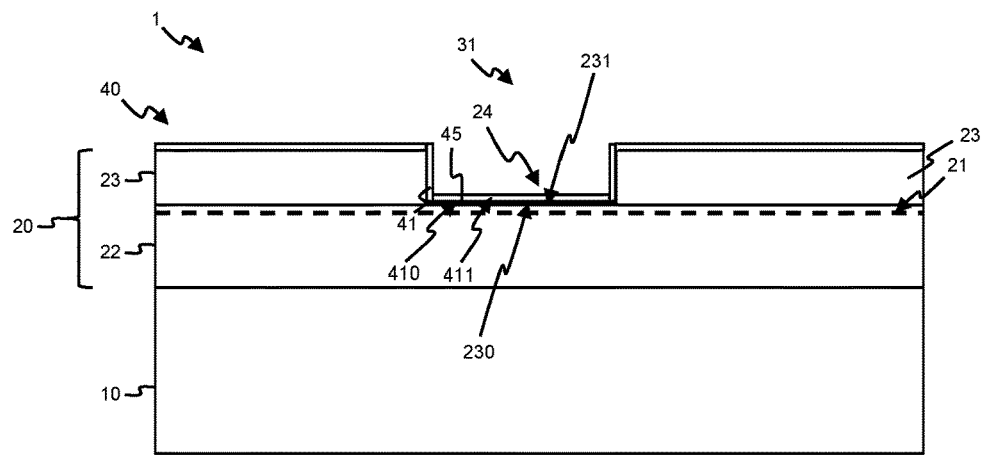
Figure 10C:
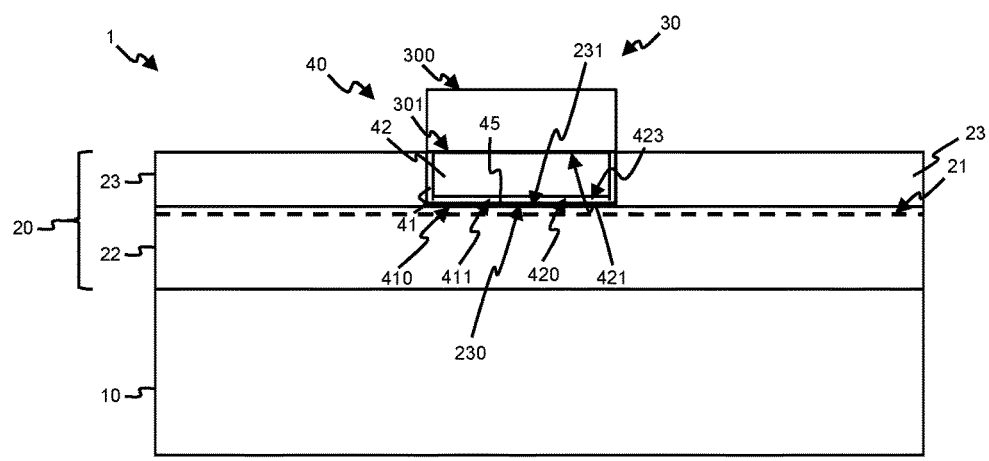

According to an embodiment shown in FIGS. 10A to 10C, a high electron mobility transistor according to the present invention is manufactured as schematically illustrated by the different steps of FIGS. 10A to 10C. Components having identical reference numbers to components in FIG. 2A to 2C and FIGS. 3A and 3B and FIGS. 4A to 4C and FIGS. 5A to 5C and FIGS. 6A to 6C and FIGS. 7A to 7C and FIGS. 8A to 8C and FIGS. 9A to 9C perform the same function. As visible in FIG. 10A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio ($Al_xGa_yN$) wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22.

Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A full recess 24 is formed in the second active III-N layer 23 in a gate region 31, thereby exposing the first active III-N layer 22. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An AlN layer 45 comprising AlN is formed in the recess 24 of the second active III-N layer 23 as illustrated on the zoom on FIG. 10A. According to an alternative embodiment, the AlN layer 45 comprising AlN is also formed in the recess 24 in the gate region 31 on the etched sidewalls of the second active III-N layer 23. The AlN layer 45 is preferably a single monolayer of AlN. The thickness of the AlN layer 45 is preferably 1 nm. An electron accepting dielectric layer 41 is formed on top of the epitaxial III-N semiconductor layer stack 20, and more particularly on top of the second active III-N layer 23, thereby being formed op top of the AlN layer 45 in the recess 24 of the second active III-N layer 23. According to an alternative embodiment, a mask is deposited on top of the second active III-N layer 23 and the mask is etched away in the gate region 31. The electron accepting dielectric layer 41 is then formed in the gate region 31 as depicted in FIG. 10C. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. The thickness of the electron accepting dielectric layer is smaller than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 10C, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 also extends in the recess 24 formed in the second active III-N layer 23. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 10C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. Ohmic contacts could be formed in a source region and a drain region as described in FIG. 10C, thereby forming a metal-oxide-semiconductor field-effect transistor 1.

Figure 11A:
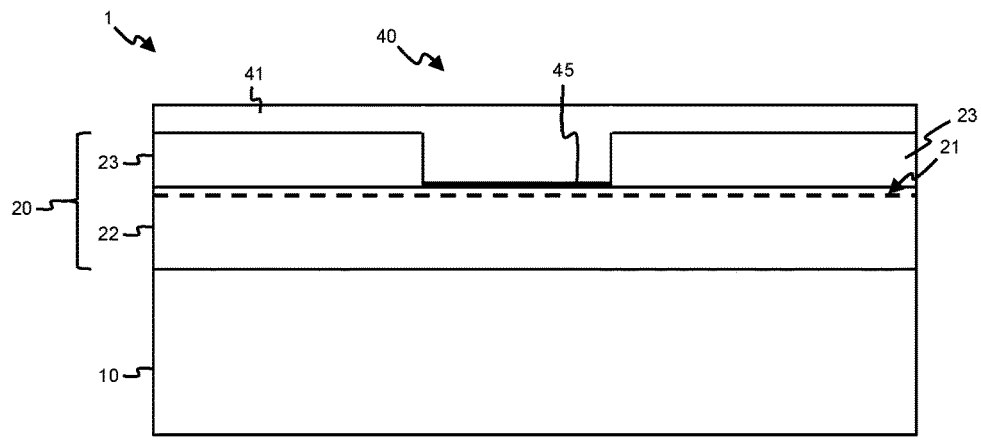
FIG. 11A to 11C schematically illustrate an embodiment of a high electron mobility transistor according to the present invention, wherein said high electron mobility transistor comprises a full recess formed in a second active III-N layer and further comprises an AlN layer.
Figure 11B:
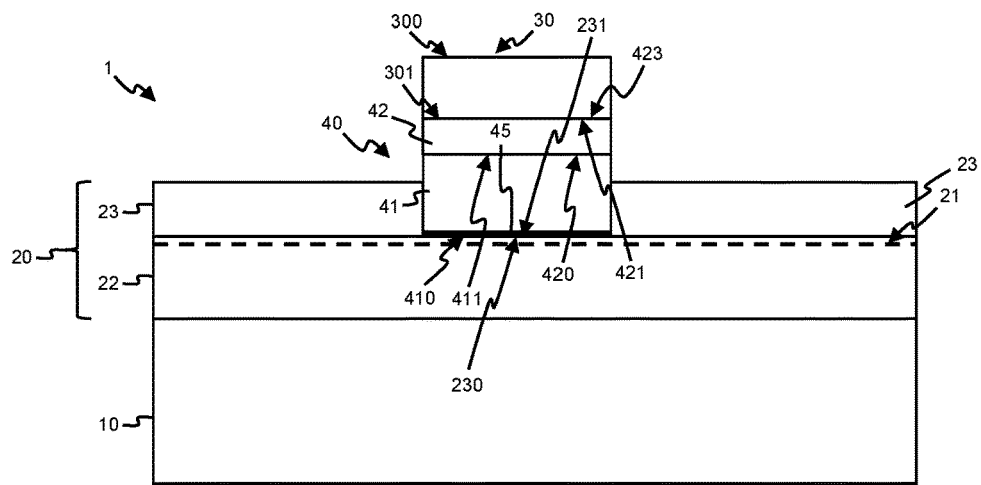
Figure 11C:
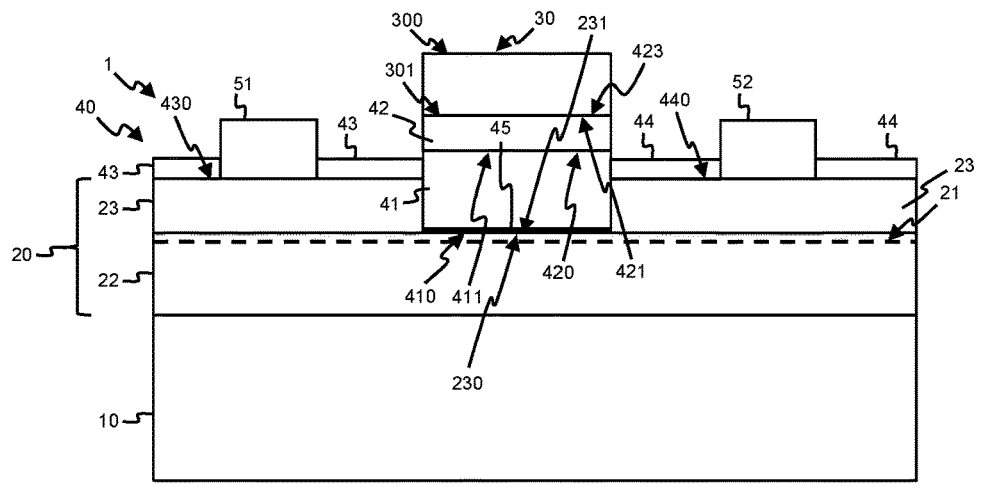

According to an embodiment shown in FIGS. 11A to 11C, a high electron mobility transistor according to the present invention is manufactured as schematically illustrated by the different steps of FIGS. 11A to 11C. Components having identical reference numbers to components in FIG. 2A to 2C and FIGS. 3A and 3B and FIGS. 4A to 4C and FIGS. 5A to 5C and FIGS. 6A to 6C and FIGS. 7A to 7C and FIGS. 8A to 8C and FIGS. 9A to 9C and FIGS. 10A to 10C. perform the same function. As visible in FIG. 11A, a semiconductor structure according to the present invention comprises a substrate 10 and an epitaxial III-N semiconductor layer stack 20. The epitaxial III-N semiconductor layer stack 20 comprises a first active III-N layer 22 and a second active III-N layer 23, with a two dimensional Electron Gas 21 between the first active III-N layer 22 and the second active III-N layer 23. The first active III-N layer 22 for example has a thickness comprised between 20 and 500 nm, preferably between 30 and 300 nm, more preferably between 50 and 250 nm, such as for example from 100 to 150 nm. The second active III-N layer 23 for example has a thickness comprised between 10 to 100 nm, preferably between 20 to 50 nm. Such a combination of thicknesses provides good characteristics for the active layer, for example in terms of the 2DEG 21 obtained. The first active III-N layer 22 comprises nitride and one or more of B, Al, Ga, In and Tl. The first active III-N layer 22 for example comprises GaN. The second active III-N layer 23 comprises nitride and one or more of B, Al, Ga, In, and Tl. The second active III-N layer 23 for example comprises AlGaN. The term AlGaN relates to a composition comprising Al, Ga and N in any stochiometric ratio $(Al_xGa_yN)$ wherein x is comprised between 0 and 1 and y is comprised between 0 and 1. Alternatively, the second active III-N layer 23 for example comprises AlN. Alternatively, the second active III-N layer 23 comprises InAlGaN. A composition such as InAlGaN comprises In in any suitable amount. Alternatively, both first active III-N layer 22 and second active III-N layer 23 comprise InAlGaN, and the second active III-N layer 23 comprises a bandgap larger than a bandgap of the first active III-N layer 22 and wherein the second active III-N layer 23 comprises a polarization larger than the polarization of the first active III-N layer 22. Alternatively, both first active III-N layer 22 and second active III-N layer 23 comprise BInAlGaN, and the second active III-N layer 23 comprises a bandgap larger than a bandgap of the first active III-N layer 22 and wherein the second active III-N layer 23 comprises a polarization larger than the polarization of the first active III-N layer 22. Compositions of the active layer may be chosen in view of characteristics to be obtained, and compositions may vary accordingly. For example, good results were obtained with a first active III-N layer 22 comprising GaN of about 150 nm thickness and a second active III-N layer 23 comprising AlGaN of about 20 nm thickness. A full recess 24 is formed in the second active III-N layer 23 in a gate region 31, thereby exposing the first active III-N layer 22. This can be achieved by etching in a plasma etching tool such as Reactive Ion Etching or RIE or preferably in an Inductively Coupled Plasma or ICP tool. The reagent gases can be $Cl_2$ or $BCl_3$. Alternatively, a digital etching process can be used, whereas consecutively and iteratively, first the top surface of the second active III-N layer is oxidized for example in $O_2$, $O_3$ or $N_2O$ plasma, after which the formed oxide is etched away e.g. in $SF_6$ or $CF_4$ plasma. An AlN layer 45 comprising AlN is formed in the recess 24 of the second active III-N layer 23. According to an alternative embodiment, the AlN layer 45 comprising AlN is also formed in the recess 24 in the gate region 31 on the etched sidewalls of the second active III-N layer 23. The AlN layer 45 is preferably a single monolayer of AlN. The thickness of the AlN layer 45 is preferably 1 nm. An electron accepting dielectric layer 41 is formed on top of the epitaxial III-N semiconductor layer stack 20, and more particularly on top of the second active III-N layer 23, thereby being formed op top of the AlN layer 45 in the recess 24 of the second active III-N layer 23. According to an alternative embodiment, a mask is deposited on top of the second active III-N layer 23 and the mask is etched away in the gate region 31. The electron accepting dielectric layer 41 is then formed in the gate region 31 as depicted in FIG. 11B. The electron accepting dielectric layer 41 comprises a passivation surface 410 in contact with the second active III-N layer 23 of the epitaxial III-N semiconductor layer stack 20. The electron accepting dielectric layer 41 further comprises a dielectric surface 411 opposite to the passivation surface 410. The second active III-N layer 23 comprises a second passivation surface 230 in contact with the passivation surface 410 of the electron accepting dielectric layer 41, thereby defining a passivation contact interface 231 between the second active III-N layer 23 and the electron accepting dielectric layer 41. The passivation contact interface 231 extends such that the passivation surface 410 is in direct contact with 10 to 30% of the second passivation surface in a gate region 31. In other words, the electron accepting dielectric layer 41 is etched away except in a gate region 31. The thickness of the electron accepting dielectric layer is larger than the depth of the recess 24 formed in the second active III-N layer 23. The electron accepting dielectric layer 41 comprises for example $Mg_xSi_{1-x}N$, wherein x is comprised between 0.05 and 0.95. According to an alternative embodiment, the electron accepting dielectric layer 41 comprises $Mg_yAl_{1-y}N$, wherein y is comprised between 0.05 and 0.95. According to a further alternative embodiment, the electron accepting dielectric layer comprises $Mg_aSi_zAl_{1-a-z}N$, wherein a is comprised between 0.05 and 0.95 and wherein z is comprised between 0.05 and 0.95 and the a+z is comprised between 0.1 and 1. The MgSiN or the MgAlN, or the MgSiAlN are epitaxially grown on top of the epitaxial III-N semiconductor layer stack 20, preferably on top of the second active III-N layer 23. As shown in FIG. 11C, the passivation stack 40 further comprises an oxide layer 42. The passivation stack 40 and more particularly the electron accepting dielectric layer 41 and the oxide layer 42 are for example grown by MOCVD. According to an alternative embodiment, the passivation stack 40 is grown by MBE. The oxide layer 42 for example comprises MgO. According to an alternative embodiment, the oxide layer 42 comprises $AlO_x$ or $SiO_x$, or alloys thereof. According to a further alternative embodiment, the oxide layer 42 comprises a gate dielectric such as for example HfOx, ZrOx, etc. The oxide layer 42 comprises an oxide surface 420 in contact with the dielectric surface 411 and a passivation insulating surface 421 opposite to the oxide surface 420. The dielectric surface 411 and the oxide surface 420 extend such that the oxide surface 420 is in direct contact with the dielectric surface 411 along the full surface of the dielectric surface 411. On FIG. 11C, a gate 30 is formed on top of the passivation stack 40 in the gate region 31. The gate 30 comprises a biasing surface 300 via which a voltage bias is applied to the gate 30 and a gate insulating surface 301 opposite to the biasing surface 300. More particularly, a gate is formed in the gate region 31 on top of the oxide layer 42, thereby defining an insulating contact interface 423 between the passivation insulating surface 421 and the gate insulating surface 301. The insulating contact interface 423 extends such that the gate insulating surface 301 is in direct contact with 100% of the passivation insulating surface 421. Ohmic contacts could be formed in a source region and a drain region as described in FIG. 11C, thereby forming a metal-oxide-semiconductor field-effect transistor 1.

Figure 12:
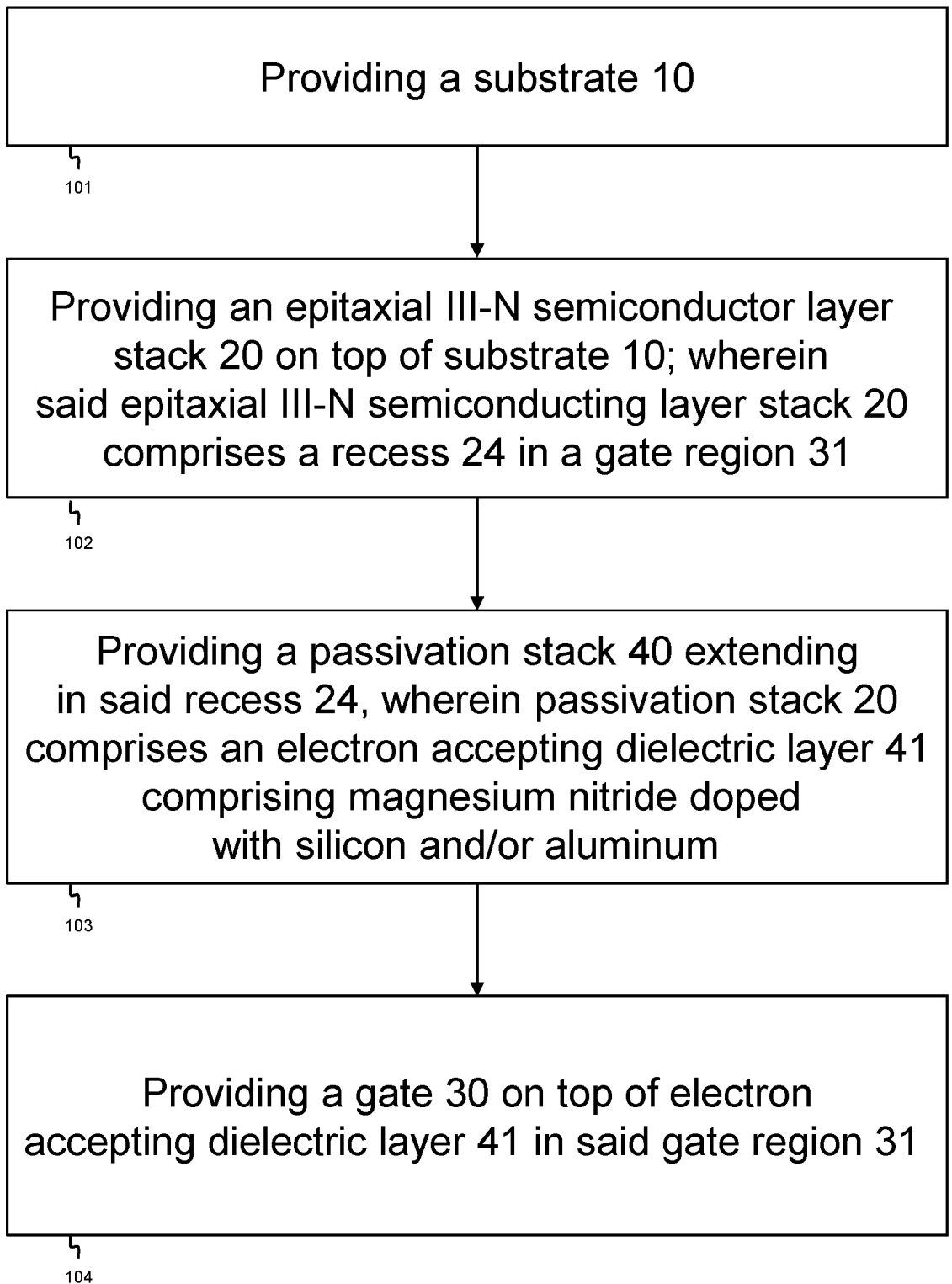
FIG. 12 schematically illustrates an embodiment of the steps of a method according to the present invention.

FIG. 12 schematically illustrates the steps of a manufacturing method of a high electron mobility transistor according to the present invention. In step 101, a substrate 10 is provided. In step 102, an epitaxial III-N semiconductor layer stack 20 is consequently provided on top of the substrate 10. The epitaxial III-N semiconductor layer stack 20 comprises an active layer comprising a first active III-N layer, a second active III-N layer on top of the first active III-N layer, wherein the second active III-N layer comprises a recess 24, and wherein a two dimensional Electron Gas between the first active III-N layer and the second active III-N layer. In step 103, a passivation stack 40 is then provided on top of the epitaxial III-N semiconductor layer stack 20. The passivation stack 40 comprises an electron accepting dielectric layer 41. The electron accepting dielectric layer 41 comprises magnesium nitride doped with silicon and/or aluminum. The electron accepting dielectric layer 41 extends in the recess 24. Finally, in step 104, a gate 30 is provided on top of the electron accepting dielectric layer 41 in a gate region 31.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A high electron mobility transistor (HEMT) for analog applications, said high electron mobility transistor comprising:
 a substrate;
 an epitaxial III-N semiconductor layer stack on top of said substrate, said epitaxial III-N semiconductor layer stack comprising an active layer, said active layer comprising:
 a first active III-N layer; and
 a second active III-N layer comprising a recess in a gate region;
 with a two-dimensional Electron Gas between said first active III-N layer and said second active III-N layer;
 a gate on top of said epitaxial III-N semiconductor layer stack and in said gate region; and
 a passivation stack between said epitaxial III-N semiconductor layer stack and said gate,
 wherein said passivation stack comprises an electron accepting dielectric layer adapted to deplete said two-dimensional Electron Gas when said gate is not biased;
 wherein said electron accepting dielectric layer extends in said recess and
 wherein said electron accepting dielectric layer comprises magnesium nitride doped with silicon and/or aluminum.

2. The HEMT according to claim 1, wherein said electron accepting dielectric layer comprises one or more of the following:
 MgSiN;
 MgAlN;
 MgSiAlN.

3. The HEMT according to claim 1, wherein said electron accepting dielectric layer comprises one or more of the following:
 $Mg_xSi_{1-x}N$, wherein x is comprised between 0.05 and 0.95;
 $Mg_yAl_{1-y}N$, wherein y is comprised between 0.05 and 0.95;
 $Mg_aSi_zAl_{1-a-z}N$, wherein a is comprised between 0.05 and 0.95 and wherein z is comprised between 0.05 and 0.95 and wherein a+z is comprised between 0.1 and 1.

4. The HEMT according to claim 1, wherein said electron accepting dielectric layer is epitaxially grown on top of said epitaxial III-N semiconductor layer stack.

5. The HEMT according to claim 1, wherein said passivation stack further comprises an oxide layer provided between the gate and the electron accepting dielectric layer.

6. The HEMT according to claim 5, wherein said oxide layer comprises MgO.

7. The HEMT according to claim 1, wherein:
said electron accepting dielectric layer comprises a passivation surface in contact with said epitaxial III-N semiconductor layer stack and a dielectric surface opposite to said passivation surface; and
said second active III-N layer comprises a second passivation surface in contact with said passivation surface of said electron accepting dielectric layer, thereby defining a passivation contact interface between said second active III-N layer and said electron accepting dielectric layer.

8. The HEMT according to claim 7, wherein said passivation contact interface extends such that said passivation surface is in direct contact with said second passivation surface along the full surface of said second passivation surface.

9. The HEMT according to claim 7, wherein:
said passivation contact interface extends such that said passivation surface is in direct contact with 10 to 30% of said second passivation surface in a gate region; and
said passivation stack further comprises two electron donating dielectric layers formed on top of said second active III-N layer and on both sides of said electron accepting dielectric layer such that each of two electron donating dielectric layers comprises a III-N contact surface in direct contact with said second active III-N layer.

10. The HEMT according to claim 7, wherein said recess in said gate region extends completely through said second active III-N layer thereby exposing said first active III-N layer.

11. The HEMT according to claim 10, wherein said electron accepting dielectric layer extends in said recess such that said passivation surface is in direct contact with said first active III-N layer in said recess.

12. The HEMT according to claim 10, wherein said passivation stack further comprises an AlN layer such that said AlN layer is in direct contact with said first active III-N layer in said recess; and
wherein said electron accepting dielectric layer extends in said recess on top of said AlN layer such that the electron accepting dielectric layer is in contact with the first active III-N layer, and wherein the passivation stack further comprises an oxide layer provided on top of the electron accepting dielectric layer such that a metal-oxide-semiconductor (MOS) type area is provided under the gate.

13. The HEMT according to claim 1, wherein said electron accepting dielectric layer comprises magnesium nitride doped with silicon.

14. The HEMT according to claim 1, wherein said electron accepting dielectric layer comprises magnesium nitride doped with aluminum.

15. A method for manufacturing a high electron mobility transistor, said method comprising the steps of:
providing a substrate;
providing an epitaxial III-N semiconductor layer stack on top of said substrate,
wherein said providing said epitaxial III-N semiconductor layer stack comprises providing an active layer comprising:
a first active III-N layer; and
a second active III-N layer;
thereby forming a two-dimensional Electron Gas between said first active III-N layer and said second active III-N layer;
forming a recess in the second active III-N layer in a gate region;
providing a passivation stack on top of said epitaxial III-N semiconductor layer stack, wherein said passivation stack comprises an electron accepting dielectric layer; and
providing a gate on top of said electron accepting dielectric layer in a gate region such that said electron accepting dielectric layer depletes said two-dimensional Electron Gas when said gate is not biased;
wherein said electron accepting dielectric layer extends in said recess and wherein said electron accepting dielectric layer comprises magnesium nitride doped with silicon and/or aluminum.

16. The method according to claim 15, wherein said providing said electron accepting dielectric layer corresponds to epitaxially growing said electron accepting dielectric layer by metalorganic chemical vapor deposition (MOCVD) or molecular-beam epitaxy (MBE) at a temperature between 700° C. and 1300° C.

17. The method according to claim 15, wherein said method further comprises the steps of:
etching said passivation stack in a source region and a drain region; and
forming an ohmic contact respectively in said source region and said drain region.

* * * * *